(12) United States Patent
Miura et al.

(10) Patent No.: US 8,683,278 B2
(45) Date of Patent: Mar. 25, 2014

(54) SEMICONDUCTOR DEVICE

(75) Inventors: Daisuke Miura, Yokohama (JP); Shinji Oyamada, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/454,763

(22) Filed: Apr. 24, 2012

(65) Prior Publication Data

US 2012/0317450 A1 Dec. 13, 2012

(30) Foreign Application Priority Data

Jun. 13, 2011 (JP) .................................. 2011-131544

(51) Int. Cl.
*G01R 31/3177* (2006.01)
*G01R 31/40* (2006.01)

(52) U.S. Cl.
USPC ........................................... 714/726; 714/733

(58) Field of Classification Search
None
See application file for complete search history.

(56) References Cited

U.S. PATENT DOCUMENTS

| | | | |
|---|---|---|---|
| 5,729,553 A * | 3/1998 | Motohara ...................... | 714/733 |
| 7,487,418 B2 | 2/2009 | Kayukawa et al. | |
| 7,490,280 B2 * | 2/2009 | Grise et al. ..................... | 714/733 |
| 2003/0204801 A1 | 10/2003 | Tkacik et al. | |
| 2004/0117705 A1 * | 6/2004 | Zounes .......................... | 714/726 |
| 2005/0235184 A1 * | 10/2005 | Yamauchi ...................... | 714/726 |
| 2007/0013566 A1 * | 1/2007 | Chuang .......................... | 341/143 |
| 2007/0226562 A1 | 9/2007 | Tkacik et al. | |
| 2008/0010570 A1 | 1/2008 | Yamazaki | |
| 2009/0300371 A1 | 12/2009 | Yoshiya | |
| 2010/0223515 A1 | 9/2010 | Nieuwland et al. | |
| 2010/0281316 A1 | 11/2010 | Miyato et al. | |

FOREIGN PATENT DOCUMENTS

| | | |
|---|---|---|
| JP | 3671948 B2 | 4/2005 |
| JP | 2006-505798 A | 2/2006 |
| JP | 2008-2841 A | 1/2008 |
| JP | 2009-505059 A | 2/2009 |
| JP | 2009-288028 A | 12/2009 |
| JP | 2010-261768 A | 11/2010 |

* cited by examiner

*Primary Examiner* — Ajay Bhatia
*Assistant Examiner* — Dipakkumar Gandhi
(74) *Attorney, Agent, or Firm* — Arent Fox LLP

(57) ABSTRACT

A semiconductor device, comprising: a user circuit having a plurality of flip-flops; and a connection path which, while in test mode, connects the plurality of flip-flops and forms a scan chain, wherein the connection path has a logic operation circuit which performs a logic operation on a non-inverted output value of any flip-flop among the plurality of flip-flops and outputs the result, or, an inverted value connection path which outputs to a following-stage flip-flop an inverted output value of any flip-flop among the plurality of flip-flops.

7 Claims, 16 Drawing Sheets

SEMICONDUCTOR DEVICE

CROSS-REFERENCE TO RELATED APPLICATION

This application is based upon and claims the benefit of priority of the prior Japanese Patent Application No. 2011-131544, filed on Jun. 13, 2011, the entire contents of which are incorporated herein by reference.

FIELD

Embodiment discussed herein relate to a semiconductor device.

BACKGROUND

Scan tests are well known as a method of testing semiconductor devices (LSIs: Large-Scale Integrated devices). FIG. 1 illustrates an example of the configuration of an LSI having scan test functions. The LSI in this figure has combinational circuits c1 to c8 comprising a plurality of circuit elements which executes data processing and computation, and scan flip-flops sf1 to sff connected to the combinational circuits c1 to c8. The scan flip-flops (hereafter "FFs") sf1 to sff have multiplexer functions.

Further, the LSI of FIG. 1 has a user mode during normal operation, and a scan mode during scan testing. In the case of the user mode, the combinational circuits c1 to c8 together with the scan flip-flops sf1 to sff perform processing of data input from an input terminal UI, and output the processing result to an output terminal UO.

On the other hand, in the case of the scan mode, a scan-in terminal SI and scan-out terminal SO are connected in series to form a scan chain. A user inputs a data pattern from the scan-in terminal SI, and the data can be set in the scan FFs sf1 to sff as arbitrary input values to the combinational circuits c1 to c8. Further, by shifting a scan chain, the user can cause a value indicating the result of processing of the combinational circuits c1 to c8, held by the scan FFs sf1 to sff, to be output from the scan-out terminal SO. By validating the data pattern output, the user can judge whether the processing of the combinational circuits c1 to c8 has been performed appropriately.

SUMMARY

However, while in an LSI such as that illustrated in FIG. 1 scan tests are made possible by forming a scan chain, the output, and input from an external device, of values held by the scan FFs sf1 to sff are made possible. For example, when the combinational circuits c1 to c8 handle billing information, passwords, or other internal information, internal information is held by the scan FFs sf1 to sff. The illicit input or output by a third party of values held by the scan FFs sf1 to sff can result in leakage or tampering of internal information. However, when an LSI does not have a scan chain, it is difficult for a user to appropriately perform validation of the combinational circuits c1 to c8.

Various techniques have been disclosed to prevent leakage and tampering of data in LSIs for which scan tests are possible (Japanese Patent Application Laid-open No. 2008-2841, Japanese Patent Application Laid-open No. 2009-505059).

In accordance with an embodiment, a semiconductor device, comprising: a user circuit having a plurality of flip-flops; and a connection path which, while in test mode, connects the plurality of flip-flops and forms a scan chain, wherein the connection path has a logic operation circuit which performs a logic operation on a non-inverted output value of any flip-flop among the plurality of flip-flops and outputs the result, or, an inverted value connection path which outputs to a following-stage flip-flop an inverted output value of any flip-flop among the plurality of flip-flops.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
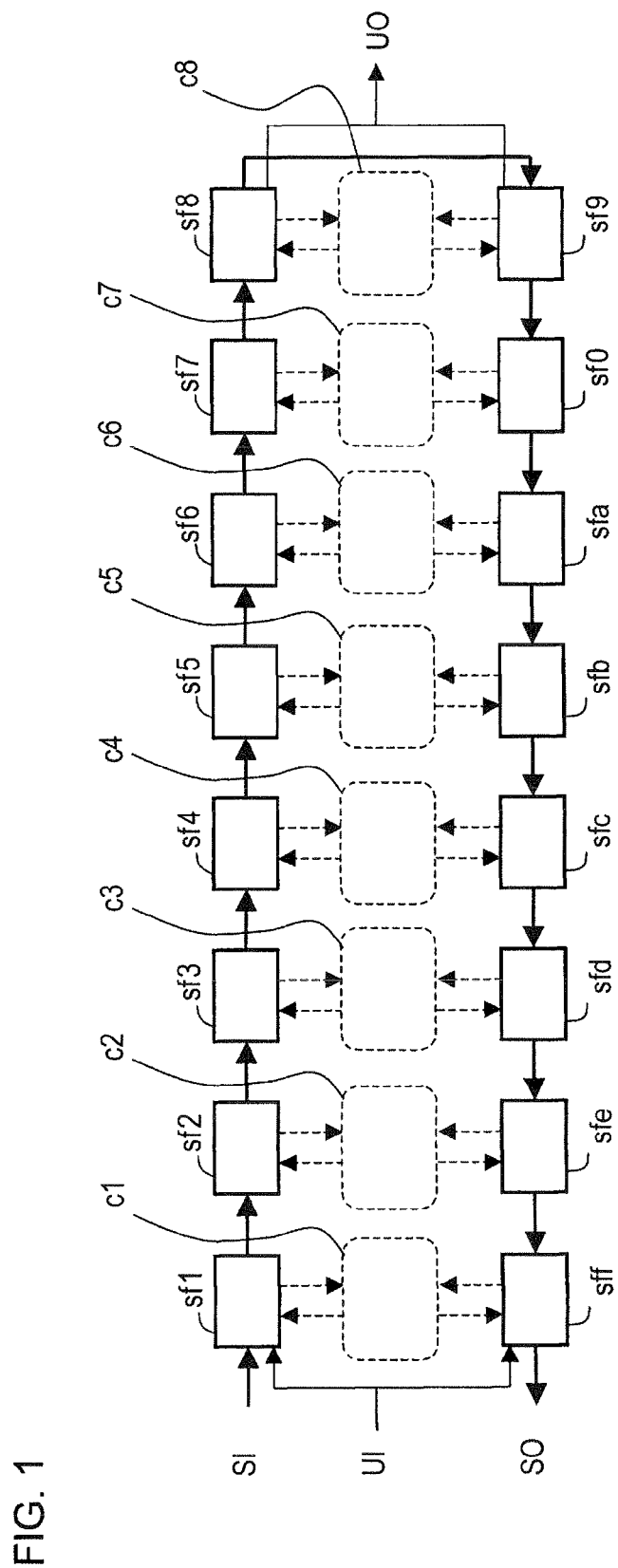
FIG. 1 is a drawing for illustrating an example of the configuration of an LSI having scan test functions.
Figure 2:
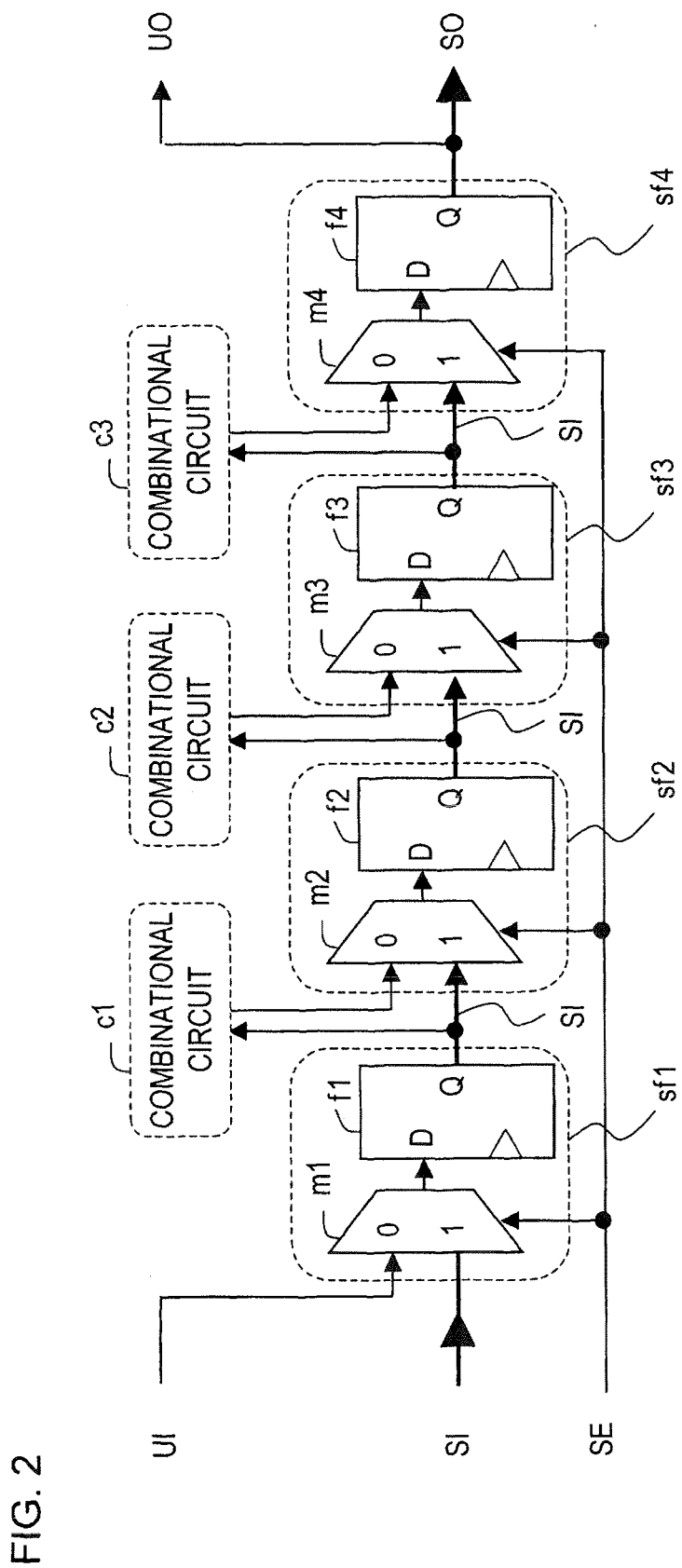
FIG. 2 is a drawing for illustrating explains specifically the scan FFs sf1 to sff of FIG. 1.

FIG. 2 explains specifically the scan FFs sf1 to sff of FIG. 1. In the figure, four scan FFs sf1 to sf4 are illustrated as examples; each of the scan FFs sf1 to sf4 has a multiplexer m1 to m4 and a flip-flop (hereafter "FF") f1 to f4. Although not illustrated, the FFs f1 to f4 and the combinational circuits c1 to c3 are supplied with a clock signal. The FFs f1 to f4 output the values being held from the Q terminals at the rising edge of the clock signal, and acquire the values output from the multiplexers m1 to m4 from the D terminals. A user circuit is a circuit inspected by scan test and indicates the FFs f1 to f4 and the combinational circuits c1 to c3.

In FIG. 2, the scan enable signal SE is a signal which selects multiplexers m1 to m4, and switches the output to the following FFs f1 to f4. Specifically, the multiplexers m1 to m4 select the scan signal SI when the scan enable signal is at high (hereafter "H") level, and select the output from the combinational circuits c1 to c3 when at low (hereafter "L") level, outputting to the following FFs f1 to f4.

Next, differences in operation in user mode and in scan mode are explained. In FIG. 2, when in user mode the scan enable signal SE is set to L level. Hence the multiplexer m1 selects the input value from the input terminal UI, and the multiplexers m2 to m4 select the output values from the preceding-stage combinational circuits c1 to c3, for output to the following FFs f1 to f4. By this means, the FFs f1 to f4 are supplied with the input value from the input terminal UI and the output values from the combinational circuits c1 to c3, and the values held by each of the FFs f1 to f4 are output to the following combination circuits c1 to c3 and to the output terminal UO.

However, in the scan mode in FIG. 2, the scan enable signal SE is set to H level. As a result, the multiplexer m1 selects the input value from the scan-in terminal SI, the multiplexers m2 to m4 select the output values of the preceding-stage FFs f1 to f3, and results are output to the following FFs f1 to f4. That is, when scan mode is set, the FFs f1 to f4 are serially connected to form a scan chain, and shift register operation is performed. As a result a data pattern for testing input from the scan-in terminal SI is input to the FFs f1 to f4, and values held by the FFs f1 to f4 are output to the scan-out terminal SO. Below, specific operation is explained based on a waveform diagram.

Figure 3:
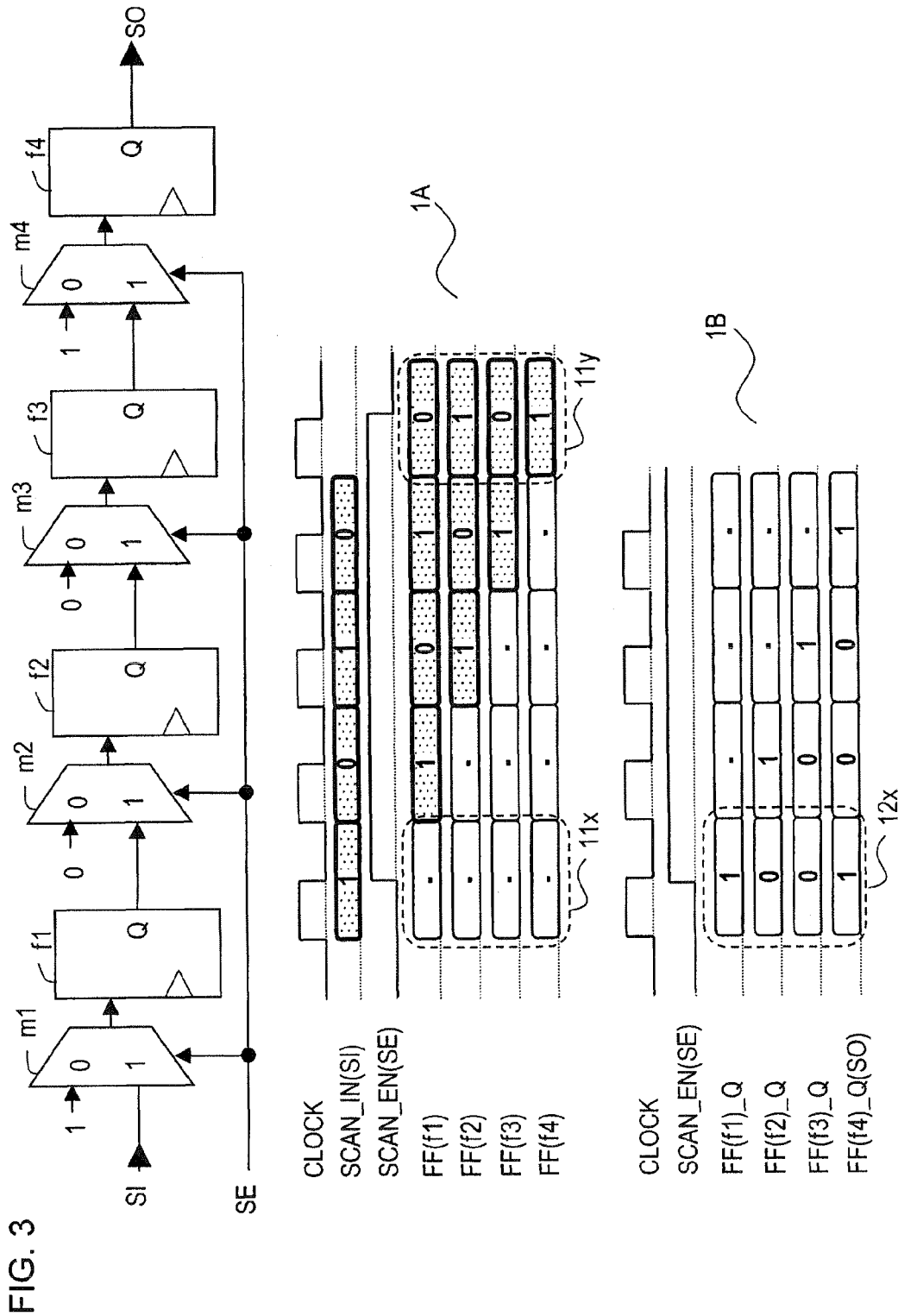
FIG. 3 is a drawing for illustrating waveform diagrams 1A and 1B of the scan FFs sf1 to sf4 of FIG. 2.

FIG. 3 presents waveform diagrams 1A and 1B of the scan FFs sf1 to sf4 of FIG. 2. In the figure, waveform diagram 1A is the waveform diagram when a data pattern for tests is input from the scan-in terminal SI, and waveform diagram 1B is the waveform diagram when the values held by the FFs f1 to f4 are output to the scan-out terminal SO. Input of the data pattern from the scan-in terminal SI and output of the values held by the FFs f1 to f4 to the scan-out terminal SO are performed simultaneously, but are explained based on separate waveform diagrams. In this example, the scan chain has four scan FFs sf1 to sf4, and the input data pattern is assumed to be 1010.

First the waveform diagram 1A in FIG. 3 is explained. The waveform diagram 1A in the figure represents an example of input from the scan-in terminal SI of a data pattern for tests 1010. In this example, initially the scan enable signal SE is set to L level, and the output values of the combinational circuits c1 to c3 at the rising edge of the previous clock cycle, for example, are held by the FFs f1 to f4 (11x). In this state, when the scan enable signal SE is changed to H level, upon each clock rising edge, shift register operation is performed.

Specifically, after the scan enable signal is changed to H level, in the first clock cycle t0 the initial value "1" of the data pattern is input to the FF f1, and in addition the values held by the FFs f2 to f4 are output to the following FFs f3 and f4 and the scan-out terminal SO. Similarly, with the scan enable signal SE still set at H level, at the rising edge of the next clock cycle the second value "0" of the data pattern 1010 is input to the FF f1, and the initial value "1" is shifted to the FF f2. In this example, after the scan enable signal SE is changed to H level, at the rising edge of the fourth clock cycle t4 the input of the data pattern 1010 to the FFs f1 to f4 is completed (11y).

When in this way a data pattern is input from the scan-in terminal SI, upon setting the scan enable signal SE to H level, upon each clock rising edge the data pattern is sequentially input to the scan FFs sf1 to sf4 by a shift register operation. For example, in the state in which input is completed (11y), when the scan enable signal is changed to L level, at the next clock rising edge the values held by the FFs f1 to f4 are input to the combinational circuits c1 to c3, and combinational circuit processing is performed based on the data pattern.

Next, the waveform diagram 1B in FIG. 3 is explained. The waveform diagram 1B in this figure presents a case in which values indicating the processing results of the combinational circuit, held by the FFs f1 to f4, are output to the scan-out terminal SO. Initially the scan enable signal SE is set to L level, and the output values from the combination circuits held at the time of the previous clock rising edge are held by the FFs f1 to f4 (12x). When in this state the scan enable signal SE is changed to H level, at the next clock rising edge t3 the values held by the FFs f1 to f3 are output to the following FFs f2 to f4, and the value held by the FF f4 is output to the scan-out terminal SO. In this example, in the fourth clock rising edge after the scan enable signal SE is changed to H level, the values held by the FFs f1 to f4 have all been output to the scan-out terminal SO.

When in this way the values held by the FFs f1 to f4 are output to the scan-out terminal SO, the scan enable signal SE is set to H level, and upon each clock rising edge the values of the FFs are sequentially output to the scan-out terminal SO by a shift register operation. The user causes values indicating the processing result of the combinational circuit, held by the FFs f1 to f4, to be output to the scan-out terminal SO, and validates whether processing of the combinational circuit is appropriate based on arbitrary data patterns.

As explained above, an LSI having a scan chain enables input to scan FFs of an arbitrary data pattern from a scan-in terminal SI, and enables output to a scan-out terminal SO of values held by scan FFs. But on the other hand, when passwords, billing information, or other internal information is held by the scan FFs, leakage or tampering of the internal information may occur.

First Embodiment

The LSI of a first embodiment has a user circuit with a plurality of FFs, and a connection path which connects a plurality of FFs while in test mode (hereafter "scan mode") to form a scan chain. The connection path has a logic operation circuit which performs a logic operation on and outputs the non-inverted output value of one FF among the plurality of FFs. Among the plurality of FFs, the non-inverted output values of the other FFs are output to the following-stage FFs without performing a logic operation. By this means, during scan mode the LSI can change the data pattern input to the FFs, and can change and cause output of values held by the FFs.

Figure 4:
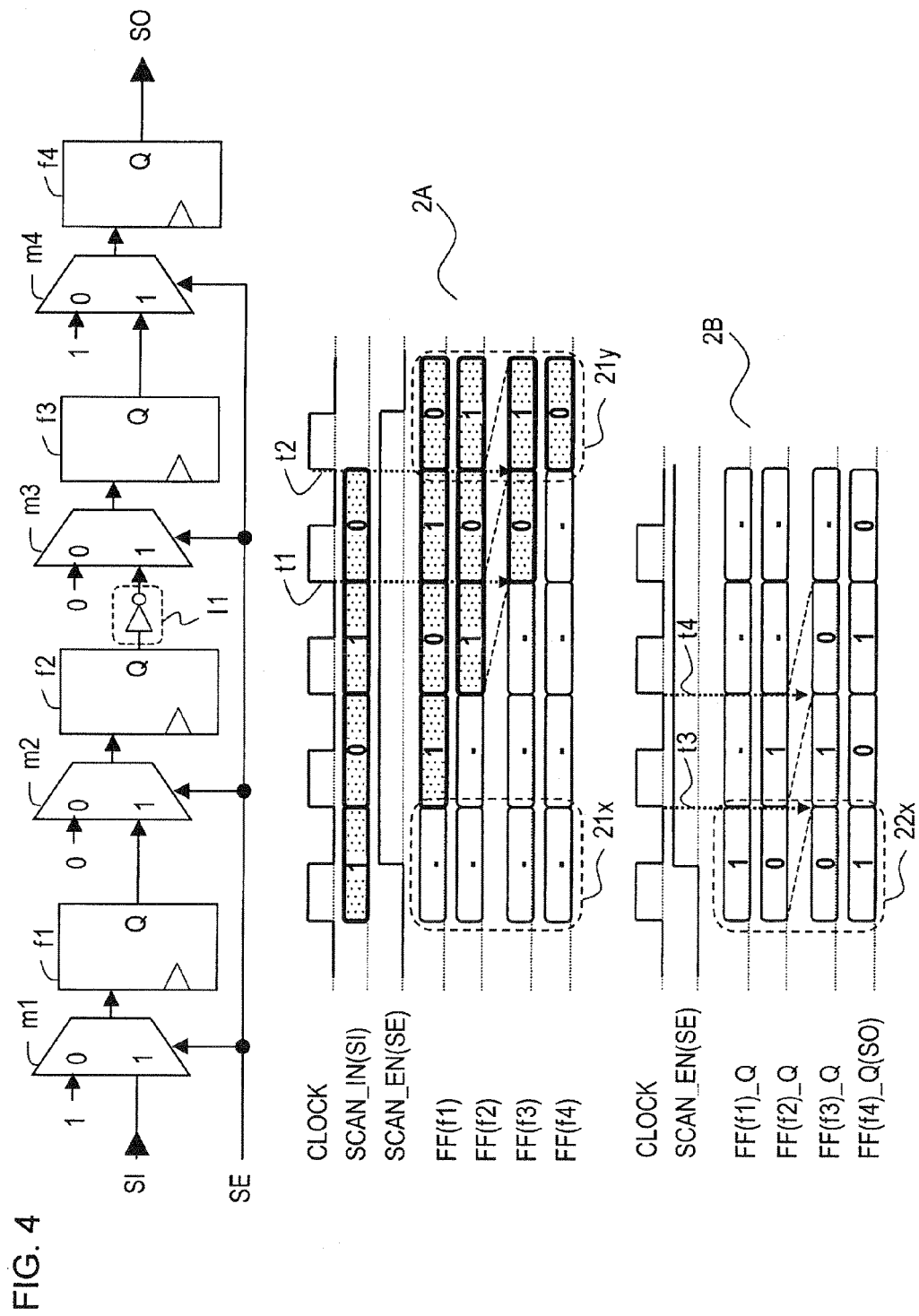
FIG. 4 is a drawing for illustrating an example of a scan chain having a logic inversion operation circuit 11, and waveform diagrams 2A, 2B thereof.

FIG. 4 presents an example of a scan chain having a logic inversion operation circuit 11 (logic operation circuit) which performs a logic inversion operation on the output value Q (non-inverted output value) of the FF f2, and waveform diagrams 2A, 2B thereof. The waveform diagram 2A is a waveform diagram for the case in which a data pattern for tests is input from the scan-in terminal SI, and the waveform diagram 2B is a waveform diagram for the case in which values held by the FFs f1 to f4 are output to the scan-out terminal SO. In the figure, the logic inversion circuit 11 is provided in the scan chain connection path, and thus is used only while in scan mode, and does not affect user mode processing. Below, a detailed explanation is given based on the waveform diagrams. Similarly to the waveform diagrams of FIG. 3, the scan chain has four scan FFs sf1 to sf4, and the input data pattern is 1010.

First, the waveform diagram 2A of FIG. 4 is explained. Similarly to the waveform diagram 1A of FIG. 3, initially the scan enable signal SE is set to L level, and output values from the combinational circuits, held at the time of the previous clock rising edge, are held by the FFs f1 to f4 (21x). In this state, when the scan enable signal is changed to H level, upon each clock rising edge the data pattern 1010 is input to the FFs f1 to f4 from the scan-in terminal SI by a shift register operation, similarly to FIG. 3.

However, in this example after the scan enable signal SE has been change to H level, the logical inverted value "0" of the first input value "1" of the data pattern is input to the FF f3 in the third clock cycle t1. Next, in the fourth clock cycle t2, the logical inverted value "1" of the second value "0" of the data pattern is input to the FF f3, and initial value "0" of the data pattern after inversion by the logical inversion circuit 11 output from the FF f3 is input to the FF f4. As a result, when the entire data pattern is input, the logical inverted values are held by the FFs f3 and f4 (21y). In this example, midway in the scan chain (between the FF f2 and the FF f3), the logical inversion circuit 11 is provided, so that only the values of a portion of the data chain are logically inverted.

In this way, by providing a logic inversion circuit I1 in the connection path of the scan chain, the values output by the FFs f1 to f4 are changed (to 0110) from the data pattern 1010. However, a user performing a scan test recognizes in advance that a logic inversion circuit I1 is provided between the FF f2 and the FF f3, and thus can prepare a data pattern and perform a scan test assuming in advance that a portion of the values is changed by the logic inversion circuit I1.

However, a third party does not recognize that a logic inversion circuit I1 is provided in the connection path of the scan chain, and so cannot input an arbitrary data pattern into the scan FFs. Further, depending on the position in the scan chain in which the logic computation circuit is installed, the change in the data pattern is different. Even in a case in which a third party recognized that a logic inversion circuit I1 is provided in the connection path of the scan chain, it would be difficult to recognize the position in the scan chain at which the logic inversion circuit I1 is installed. Hence the LSI of this embodiment makes it difficult for a third party to input an arbitrary data pattern into the scan FFs, and suppresses tampering and similar of internal information through misuse of the scan chain.

Next, the waveform diagram 2B in FIG. 4, in which values held by the FFs f1 to f4 are output to the scan-out terminal SO, is explained. Similarly to the waveform diagram 1B in FIG. 3, initially the scan enable signal SE is set to L level, and the output values from the combinational circuits held at the time of the preceding clock rising edge are held in the FFs f1 to f4 (22x). When in this state the scan enable signal SE is changed to H level, upon each clock rising edge the values held by the FFs f1 to f4 are output to the scan-out terminal SO by a shift register operation, similarly to FIG. 3.

However, in this example, in the first clock cycle t3 after the scan enable signal SE is changed to H level, the logical inverted value "1" of the value "0" held by the FF f2 is input to the FF f3. Next, in the second clock cycle t4, the output value "1" from the FF f2 which had initially been held by the FF f1 is logically inverted to "0" and input to the FF f3, and the output value "1" from the FF f3 which had been logically inverted in the previous clock cycle is input to the FF f4. As a result among the values initially held (22x) by the FFs f1 to f4, the values held by the FFs f1 and f2 are logically inverted and output to the scan-out terminal SO. Further, because a logic inversion circuit 11 is provided midway in the scan chain (between the FF f2 and the FF f3), only the values held by a portion of the FFs, f1 and f2, are logically inverted and output to the scan-out SO.

However, a user performing a scan test recognizes in advance that a logic inversion circuit I1 is provided between the FF f2 and the FF f3 comprised by the scan chain, and thus can restore the values before the change by the logic inversion circuit I1 from the data pattern output to the scan-out terminal SO. Based on the restored data pattern, the user can perform validation as to whether the processing of the combination circuit is performed appropriately.

However, a third party would not recognize that a logic inversion circuit I1 is provided in the connection path of the scan chain, and could not acquire the values as held in the FFs. Further, depending on the position in the scan chain at which the logic inversion circuit is installed, the change in the data pattern is different. Even in a case where a third party recognized that the logic inversion circuit I1 is provided in the connection path of the scan chain, it would be difficult to recognize in which position of the scan chain the logic inversion circuit I1 is installed. Consequently it would be difficult for the third party to restore the original values held by the FFs based on the data pattern changed by the logic inversion circuit. Hence the LSI of this embodiment makes it difficult for a third party to acquire internal information held by the FFs, and suppresses leakage and similar of internal information through misuse of the scan chain.

In this way, because in the LSI of this embodiment the connection path has a logic computation circuit which performs a logic operation (logic inversion operation) on FF output values (non-inverted output values) and outputs the result, leakage and tampering of internal information in the LSI by a third party using the scan chain can be suppressed. However, a user, by recognizing the installed state of the logic computation circuit in the connection path, can generate a data pattern which assumes changes in values by the logic computation circuit, and can restore the values prior to the change by the logic computation circuit from the data pattern output to the scan-out terminal SO. As a result, the LSI of this embodiment can suppress tampering and leakage of internal information by misuse of the scan chain, while enabling scan tests.

Second Embodiment

The LSI of a second embodiment has a user circuit with a plurality of FFs, and a connection path forming a scan chain which connects a plurality of FFs while in test mode (hereafter "scan mode"). The connection path has an inverted value connection path which outputs the inverted output value of an FF among the plurality of FFs to the following-stage FF. Of the plurality of FFs, the other FFs output the non-inverted output values to the following-stage FFs. As a result, while in scan mode the LSI can change a data pattern input to the FFs, and can change and output values held in the FFs.

Figure 5:
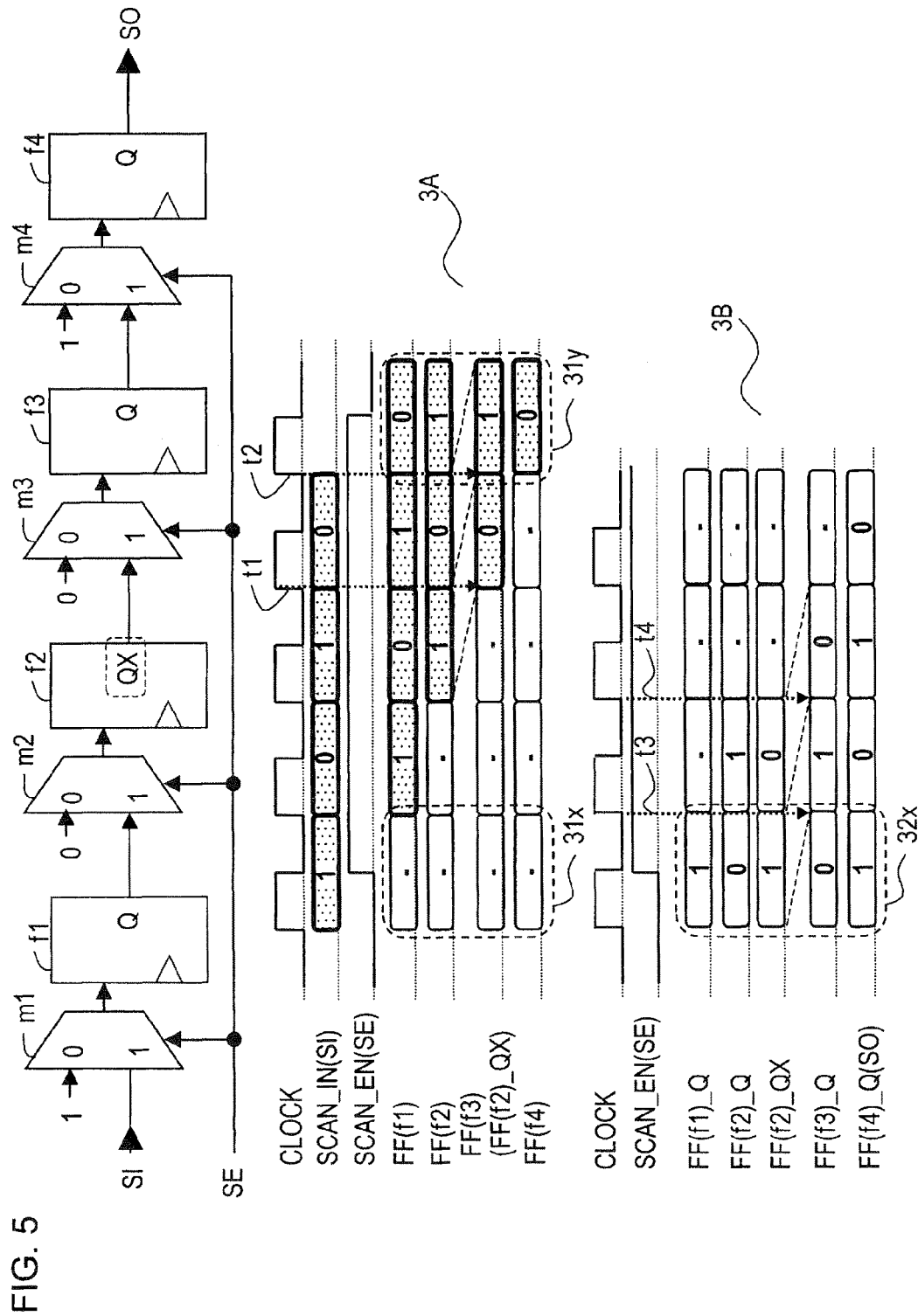
FIG. 5 is a drawing for illustrating an example of a scan chain having a connection path, and the waveform diagrams thereof 3A, 3B.

FIG. 5 illustrates an example of a scan chain having a connection path (inverted value connection path) which outputs the logical inverted value QX (inverted output value) of the FF f2 to the following-stage FF f3, and the waveform diagrams thereof 3A, 3B. The waveform diagram 3A is the waveform diagram for a case in which a data pattern for tests is input from the scan-in terminal SI, and the waveform diagram 3B is the waveform diagram for a case in which values held by the FFs f1 to f4 are output to the scan-out terminal SO. In the figure, a connection path which outputs the logical inverted value QX of the FF f2 to the following-stage FF f3 is provided in the connection path of the scan chain, and so is used only in the case of scan mode, and does not affect user mode processing. Below, a detailed explanation is given based on the waveform diagrams. Similarly to the waveform diagrams of FIG. 3, the scan chain has four scan FFs sf1 to sf4, and the input data pattern is 1010.

First the waveform diagram 3A of FIG. 5 is explained. Similarly to the waveform diagram 1A of FIG. 3, initially the scan enable signal SE is set to L level, and output values from the combinational circuits at the time of the preceding clock rising edge, for example, are held by the FFs f1 to f4 (31x). When in this state the scan enable signal is changed to H level, upon each clock rising edge the data pattern 1010 is input to the FFs f1 to f4 from the scan-in terminal SI by a shift register operation, similarly to FIG. 3.

However, in this example, in the third clock cycle t1 after the scan enable signal SE is changed to H level, the logic inverted value QX "0" of the value "1" held by the FF f2 is input to the FF f3. Next, in the fourth clock cycle t2, the logic inverted value QX "1" of the second value "0" in the data pattern is input to the FF f3, and the first value "0" of the data pattern output from the FF f3 and which has been logically inverted by the FF f2 is input to the FF f4. As a result, similarly to the waveform diagram 2A of FIG. 3, when the entire data pattern has been input, logically inverted values are held by the FFs f3 and f4 (31y). In this example also, by installing a FF f2 which outputs the logical inverted value QX midway in the scan chain, only a portion of the input data pattern is logically inverted.

In this way, through output of the logical inverted value Qx by the FF f2, the values input to the FFs f1 to f4 are changed from the data pattern 1010 (to 0110). However, a user performing a scan test recognizes in advance that the logic inverted value QX of the FF f2 in the scan chain is output to the FF f3, and so can prepare a data pattern which assumes in advance changes in values due to the logic inverted value output of the FF f2, and can perform scan tests.

However, a third party would not recognize that an inverted value connection path which outputs the logic inverted value QX to the following-stage FF is provided in the scan chain, and could not input an arbitrary data pattern to the scan FFs. Further, the changes in the data pattern are different depending on the position in the scan chain at which the inverted value connection path is installed. Hence even if a third party were to recognize that an inverted value connection path is provided in the scan chain, it would be difficult to recognize the position in the scan chain at which the inverted value connection path is installed. Hence the LSI of this embodiment makes it difficult for a third party to input an arbitrary data pattern to the scan FFs, and can suppress tampering of internal information through misuse of the scan chain.

Next, the waveform diagram 2B of FIG. 5 is explained. Similarly to the waveform diagram 1B of FIG. 3, initially the scan enable signal SE is set to L level, and the output values of the combinational circuits at the time of the preceding clock rising edge are held in the FFs f1 to f4 (32x). When in this state the scan enable signal SE is changed to H level, upon each clock rising edge the values held by the FFs f1 to f4 are output to the scan-out terminal SO by a shift register operation, similarly to FIG. 3.

However, in this example, in the first clock cycle t3 after the scan enable signal SE is changed to H level, the logic inverted value QX "1" of the value "0" held by the FF f2 is input to the FF f3. Then, in the second clock cycle t4, the logic inverted value QX "0" of the value "1" held initially in the FF f1 is input to the FF f3, and the value "1" output from the FF f3 which had been logically inverted in the preceding clock cycle is input to the FF f4. As a result, among the values (32x) initially held by the FFs f1 to f4, the values held by the FFs f1 and f2 are logically inverted, and are output to the scan-out terminal SO. In this example also, the FF f2 which outputs the logic inverted value QX is installed midway in the scan chain, so that only the values held by a portion of the FFs f1 and f2 are logically inverted and output to the scan-out terminal SO.

However, a user performing a scan test recognizes in advance that the logic inverted value QX of the FF f2 in the scan chain is output to the FF f3, and thus can restore the value prior to change by the logic inverted output of the FF f2 from the data pattern output to the scan-out terminal SO. Based on the restored data pattern, the user can validate whether the processing of the combinational circuit is performed appropriately.

However, a third party would not recognize that an inverted value connection path which outputs a logical inverted value QX to the following-stage FF is provided in the scan chain, and could not acquire the values as held in the FFs. Further, depending on the position in the scan chain in which the inverted value connection path is installed, the change in the data pattern is different. Even in a case in which a third party recognized that an inverted value connection path is provided in the scan chain, it would be difficult to recognize the position in the scan chain at which the inverted output path is installed. Hence it is difficult for a third party to restore the original values held by the FFs based on the data pattern changed by the inverted output path. Thus the LSI of this embodiment makes it difficult for a third party to acquire internal information held by the FFs, and suppresses leakage and similar of internal data through misuse of the scan chain.

In this way, because in the LSI of this embodiment the connection path has an inverted value connection path which outputs the FF logical inverted value QX (inverted output value) to the following-stage FF, leakage and tampering of internal information of the LSI by a third party using the scan chain can be suppressed. However, the user, by recognizing the number and installed positions of inverted value connection paths provided in the scan chain, can generate a data pattern assuming changes in values by the inverted value connection paths, and can restore the values before changes by the inverted value connection paths from the data pattern output to the scan-out terminal SO. As a result, the LSI of this embodiment can suppress tampering and leakage of internal information through misuse of the scan chain, while enabling scan tests.

Further, in the LSI of this embodiment, there is no need to provide a separate logic computation circuit in the connection path such as that of the first embodiment (the logic computation circuit I1 in FIG. 4). As a result, the LSI of this embodiment makes it more difficult for a third party to analyze the connection path of the scan chain based on the LSI layout pattern. Hence the LSI of this embodiment can more effectively suppress tampering and leakage of internal information by a third party.

In the first and second embodiments, examples were presented of LSIs in which the connection path has one logic inversion circuit I1 or inverted value connection path. However, a scan chain may have a plurality of either logic inversion circuits, or inverted value connection paths, or both.

Figure 6:
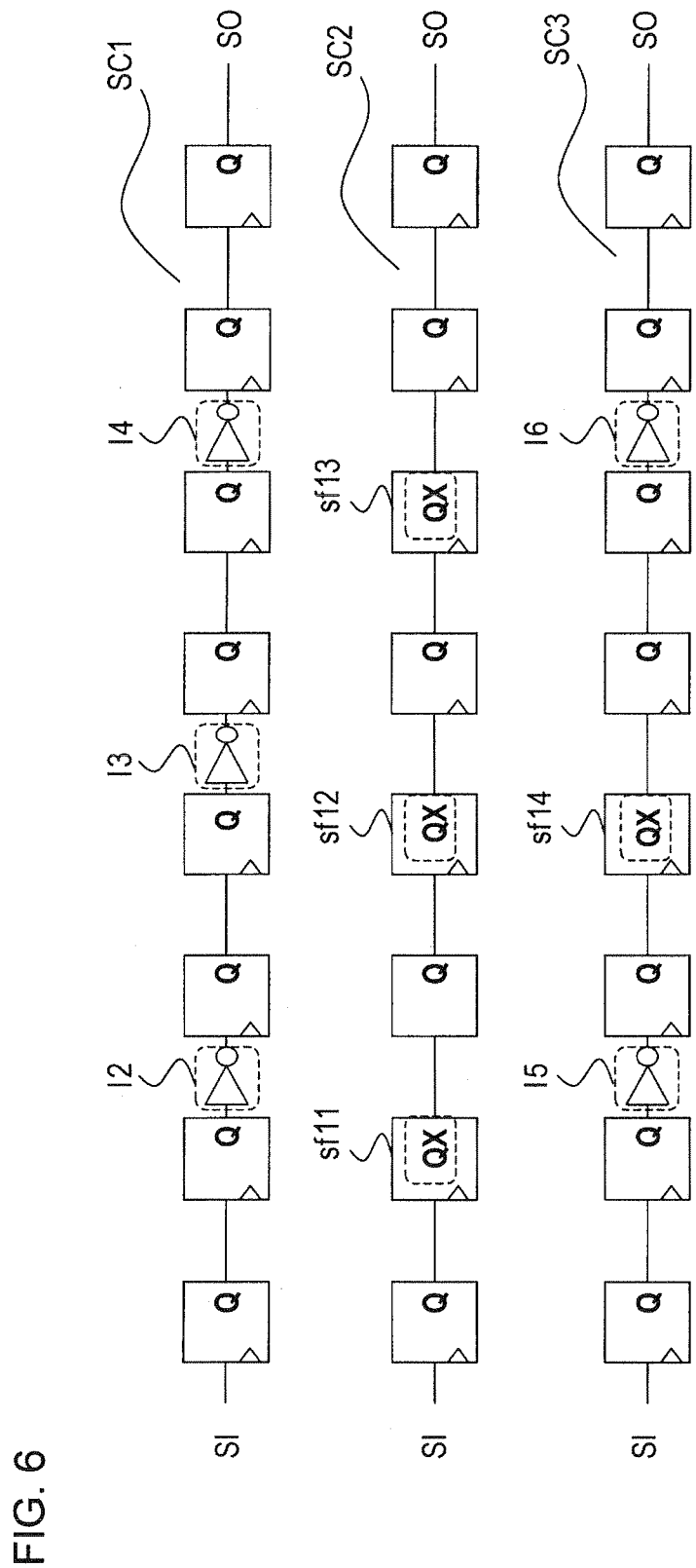
FIG. 6 is a drawing for illustrating examples of scans chain having a plurality of logic inversion circuits and inverted value connection paths.

FIG. 6 illustrates examples of scans chain having a plurality of logic inversion circuits and inverted value connection paths. In the figure, the scan chain SC1 has three logic inversion circuits 12 to 14, and the scan chain SC2 has three scan FFs sf11 to sf13 which output logical inverted values QX. The scan chain SC3 has a combination of two logic inversion circuits 15 and 16, and a scan FF sf14 which outputs a logical inverted value QX.

For example, a third party may cause an arbitrary data pattern to be input to and output from the scan chain, and by analyzing mutations in the data pattern before and after, may analyze the state of installation of logic inversion circuits and inverted value connection paths provided in the scan chain (analysis of the scan chain connection path). However, by installing a plurality of distributed logic inversion circuits and inverted value connection paths in a scan chain having a very large number of FFs, the mutations in the data pattern become more complicated, and analysis of the scan chain is made more difficult. Hence in an LSI of this embodiment, by installing a plurality of distributed logic inversion circuits and inverted value connection paths in the connection path of the scan chain, analysis of the connection path is made more difficult, and the effect in suppressing tampering and leakage of internal information can be further enhanced.

Third Embodiment

The LSI in a third embodiment has a user circuit with a plurality of FFs, and a connection path which while in a test mode (hereafter "scan mode") connects a plurality of FFs to form a scan chain. The connection path has a logic operation circuit, which takes as inputs the non-inverted output value of one of the plurality of FFs and a prescribed value, and performs one logic operation among those of an AND operation circuit, an OR operation circuit, an XOR operation circuit, a NAND operation circuit, a NOR operation circuit, and an XNOR operation circuit. Among the plurality of FFs, the non-inverted output values of the other FFs are output to the following-stage FFs without performing a logic operation.

In this way, while in scan mode the LSI can change a data pattern input to the FFs, and can change and output values held by the FFs. Further, the LSI makes it difficult for a third party to analyze the scan chain, and can more effectively suppress leakage and tampering of internal information.

Specifically, in this embodiment an example is presented in which the connection path of the scan chain has a logic operation circuit which performs a non-exclusive logical sum (hereafter "XOR") operation on the output value (non-inverted output value) from the FF f2 and a pseudorandom value (prescribed value). However, the operation performed by the logic operation circuit is not limited to an XOR operation, but may be any one among an AND operation, an OR operation, a NAND operation, a NOR operation, an XNOR operation, and similar. Further, the prescribed value is not limited to a pseudorandom value, but may be a fixed value or a value based on a prescribed pattern.

Figure 7:
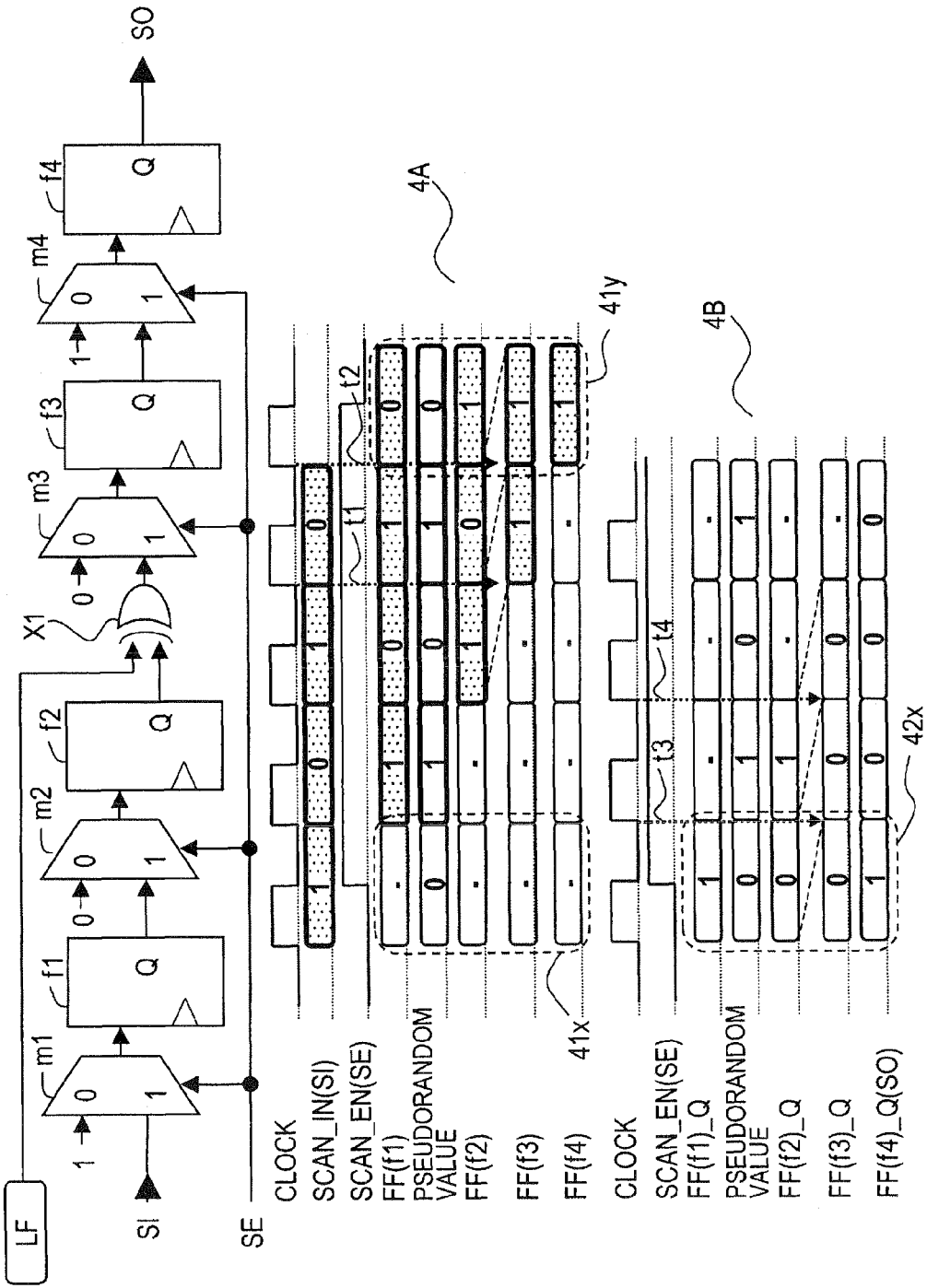
FIG. 7 is a drawing for illustrating an example of a scan chain having a logic operation circuit X1, and waveform diagrams 4A and 4B thereof.

FIG. 7 presents an example of a scan chain having a logic operation circuit X1 which performs an XOR operation on the output value (non-inverted output value) of the FF f2 and a pseudorandom value (prescribed value), and waveform diagrams 4A and 4B thereof. The logic operation circuit X1 in the figure outputs, to the FF f3, the value "0" when the pseudorandom value and the output value of the FF f2 are the same, and "1" otherwise. The pseudorandom value is generated by a pseudorandom number generation circuit LF and is output to the logic operation circuit X1. The logic operation circuit X1 is provided in the connection path of the scan chain, and thus is used only when in scan mode, and does not affect processing in user mode.

Figure 8:
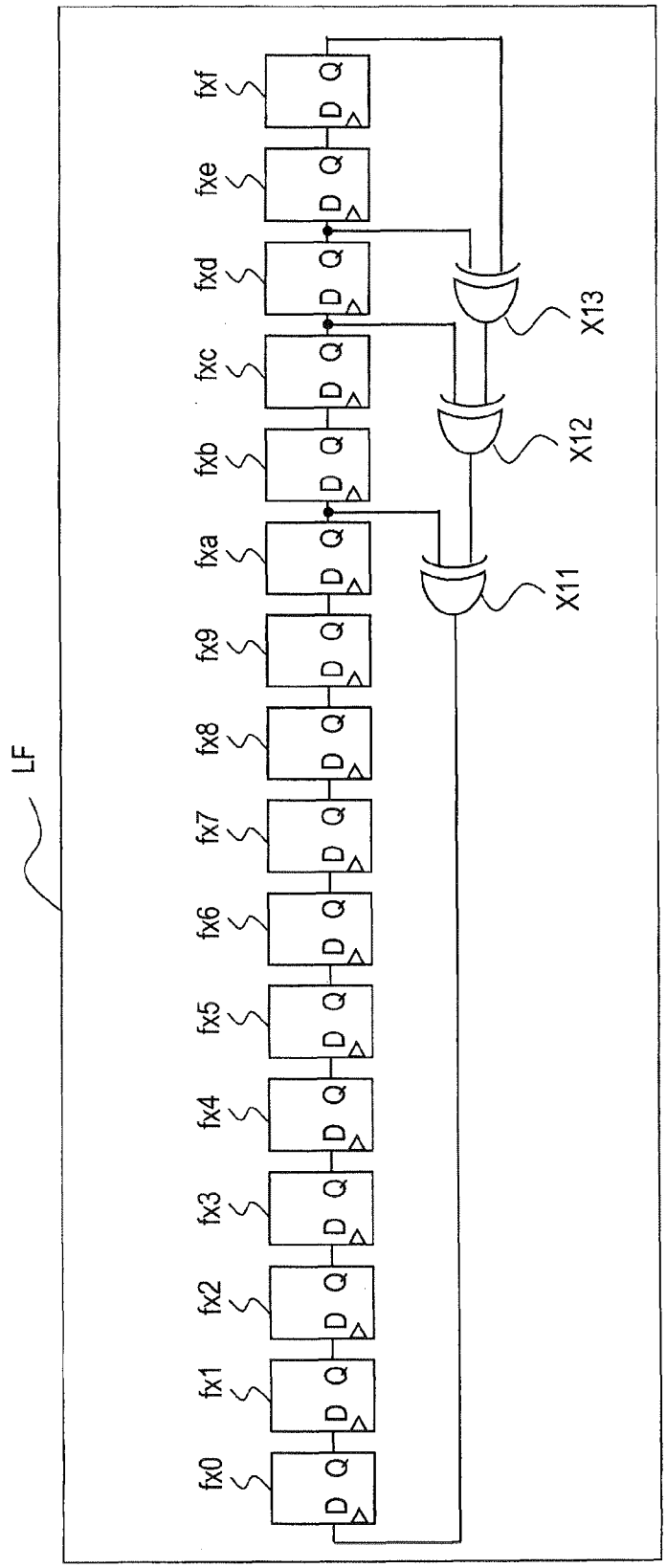
FIG. 8 is a drawing for illustrating an example of the pseudorandom number generation circuit LF.

FIG. 8 illustrates an example of the pseudorandom number generation circuit LF. The pseudorandom number generation circuit LF of the figure is a linear feedback shift register having a plurality of registers fx0 to fxf and logic operation circuits X11 to X13. Because there are a finite number of states which can be taken by the registers fx0 to fxf, random number values (0 or 1) are output in a cyclic pattern. By this means, a user can recognize in advance the output pattern of values output from the pseudorandom number generation circuit LF. However, for a third party to identify the pattern of random values output from the pseudorandom number generation circuit LF would require an enormous amount of time, and would be difficult. The pseudorandom number generation circuit LF is not limited to the example of the figure. For example, in order to make identification of the pattern of pseudorandom values output more difficult, the user may provide the LSI with a plurality of pseudorandom number generation circuits LF, and may periodically switch the pseudorandom number generation circuit LF being used.

Returning to FIG. 7, the waveform diagram 4A is the waveform diagram for a case in which a data pattern for tests is input from the scan-in terminal SI, and the waveform diagram 4B is the waveform diagram for a case in which values held by the FFs f1 to f4 are output to the scan-out terminal SO. Similarly to the waveform diagrams of FIG. 3, the scan chain has four scan FFs sf1 to sf4, and the input data pattern is 1010. Below, a specific explanation is given based on the waveform diagrams.

First the waveform diagram 4A is explained. Similarly to the waveform diagram 1A of FIG. 3, initially the scan enable signal SE is set to L level, and the output values from the combination circuits held for example at the time of the previous clock rising edge are held by the FFs f1 to f4 (41x). When in this state the scan enable signal is changed to H level, upon each clock rising edge the data pattern 1010 is input to the FFs f1 to f4 from the scan-in terminal SI by a shift register operation, similarly to FIG. 3.

However, in this example, "1", which is the result of an XOR operation of the first value "1" in the data pattern output from the FF f2 and the pseudorandom value "0" by a logic operation circuit X1, is output to the FF f3 in the third clock cycle t1 after the scan enable signal is changed to H level. Next, in the fourth clock cycle t2, the result "1" of the logic operation circuit X1 latched in the previous clock cycle is output to the FF f4 from the FF f3, and the value "1", which is the result of an XOR operation between the second value "0" in the data pattern output from the FF f2 and the pseudorandom value "1" by the logic operation circuit X1, is output to the FF f3. As a result, when the entire data pattern has been input, the results of operations between the first two values of the data pattern and pseudorandom values are held in the FFs f3 and f4 (41y). In this example also, by installing the logic operation circuit X1 midway in the scan chain, only a portion of the input data pattern is changed to the logic operation result values.

In this way, by providing a logic operation circuit X1 in the connection path of the scan chain, values set in the FFs f1 to f4 are changed from the data pattern 1010 (to 1110). However, a user performing a scan test recognizes in advance that the logic operation circuit X1 is provided between the FF f2 and the FF f3, as well as the operation performed and the pattern of the pseudorandom values, and thus can prepare a data pattern which assumes in advance that values are changed by the logic operation circuit X1 and can perform a scan test.

However, even supposing that a third party recognizes that a logic operation circuit X1 is provided in the connection path of the scan chain, it would be difficult to identify the operation and the installed position of the logic operation circuit X1 and the pattern of pseudorandom values, and to generate a data pattern assuming in advance the changes made to values by the logic operation circuit X1. Thus the LSI of this embodiment makes input of an arbitrary data pattern by a third party to the FFs of the scan chain more difficult, and more effectively suppresses tampering and the like of internal information through misuse of the scan chain.

Next, the waveform diagram 4B, for the case where values held by the FFs f1 to f4 in FIG. 7 are output to the scan-out terminal SO, is explained. Similarly to the waveform diagram 1B of FIG. 3, initially the scan enable signal SE is set to L level, and output values from the combinational circuits held at the time of the previous clock rising edge are held in the FFs f1 to f4 (42x). When in this state the scan enable signal SE is changed to H level, upon each clock rising edge the values held by the FFs f1 to f4 are output to the scan-out terminal SO by a shift register operation, similarly to FIG. 3.

However, in this example the value "0" which is the result of an XOR operation by the logic operation circuit X1 on the value "0" output from the FF f2 and the pseudorandom value "0" is output to the FF f3 in the first clock cycle t3 after the scan enable signal is changed to H level. In the subsequent second clock cycle t4, the result "0" of the logic operation circuit X1 latched in the previous clock cycle is output from the FF f3 to the FF f4, and moreover the value "0" which is the result of operation by the logic operation circuit X1 on the output value "1" from the FF f2 and the pseudorandom value "1" is output to the FF f3. As a result, among the values initially held by the FFs f1 to f4 (42x), the values held by the FFs f1 and f2 are changed to the operation result values and output to the scan-out terminal SO. In this example also, by installing the logic operation circuit X1 midway in the scan chain, only the values held by a portion of the FFs f1 and f2 are changed to operation result values and output to the scan-out terminal SO.

However, a user performing a scan test recognizes in advance that a logic operation circuit X1 is provided between the FF f2 and the FF f3, as well as the operation performed and the pattern of the pseudorandom values, and thus can restore the values of the FFs prior to change by the logic operation circuit X1 from the data pattern output to the scan-out terminal SO. And, based on the restored data pattern, the user can validate whether the processing of the combinational circuit has been performed appropriately.

However, even supposing that a third party recognizes that a logic operation circuit X1 is provided in the connection path of the scan chain, it would be difficult to identify the operation and the installed position of the logic operation circuit X1 and the pattern of pseudorandom values, and to restore the values of the FFs prior to change by the logic operation circuit X1. Thus the LSI of this embodiment makes acquisition by a third party of internal information held in the FFs of the scan chain difficult, and can more effectively suppress leakage and similar of internal information through misuse of the scan chain.

In this way, because in the LSI of this embodiment the connection path has a logic operation circuit which performs a logic operation on the output value (non-inverted output value) of an FF and a prescribed value (pseudorandom value) and outputs the result, the effect of suppressing leakage and tampering of internal information in the LSI by a third party using the scan chain can be enhanced. However, a user who recognizes the installed state of a logic operation circuit in the connection path can generate a data pattern assuming changes in values by the logic operation circuit, and can restore the data pattern output to the scan-out terminal SO to the values prior to change by the logic operation circuit. As a result, the LSI of this embodiment can more effectively suppress tampering and leakage of internal information through misuse of the scan chain, while enabling scan tests.

Fourth Embodiment

The LSI of a fourth embodiment has a user circuit with a plurality of FFs operating in synchronization with a first clock, a connection path which while in test mode connects a plurality of FFs to form a scan chain which performs shift operations in synchronization with the first clock, and a clock generation circuit which performs a logic operation on a prescribed value and the first clock and outputs a second clock. One of the FFs among the plurality of FFs operates in synchronization with the second clock while in test mode (hereafter "scan mode"), and operates in synchronization with the first clock while in user mode. Among the plurality of FFs, the other FFs operate in synchronization with the first clock even while in scan mode.

In this way, the LSI can omit or change a portion of an data pattern input to the FFs while in scan mode, and can omit or change a portion of the values held by the FFs and cause the values to be output. Further, the LSI makes it difficult for a third party to analyze the scan chain, and can more effectively suppress leakage and tampering of internal information.

Specifically, in this embodiment a case is explained in which a clock generation circuit outputs a second clock obtained by an XOR (logical product) operation on a first clock and a pseudorandom value (prescribed value). However, the logical operation is not limited to an XOR operation, but may be any one among an AND operation, an OR operation, a NAND operation, a NOR operation, an XNOR operation, and similar. Further, the prescribed value is not limited to a pseudorandom value, but may be a fixed value or a value based on a prescribed pattern.

Figure 9:
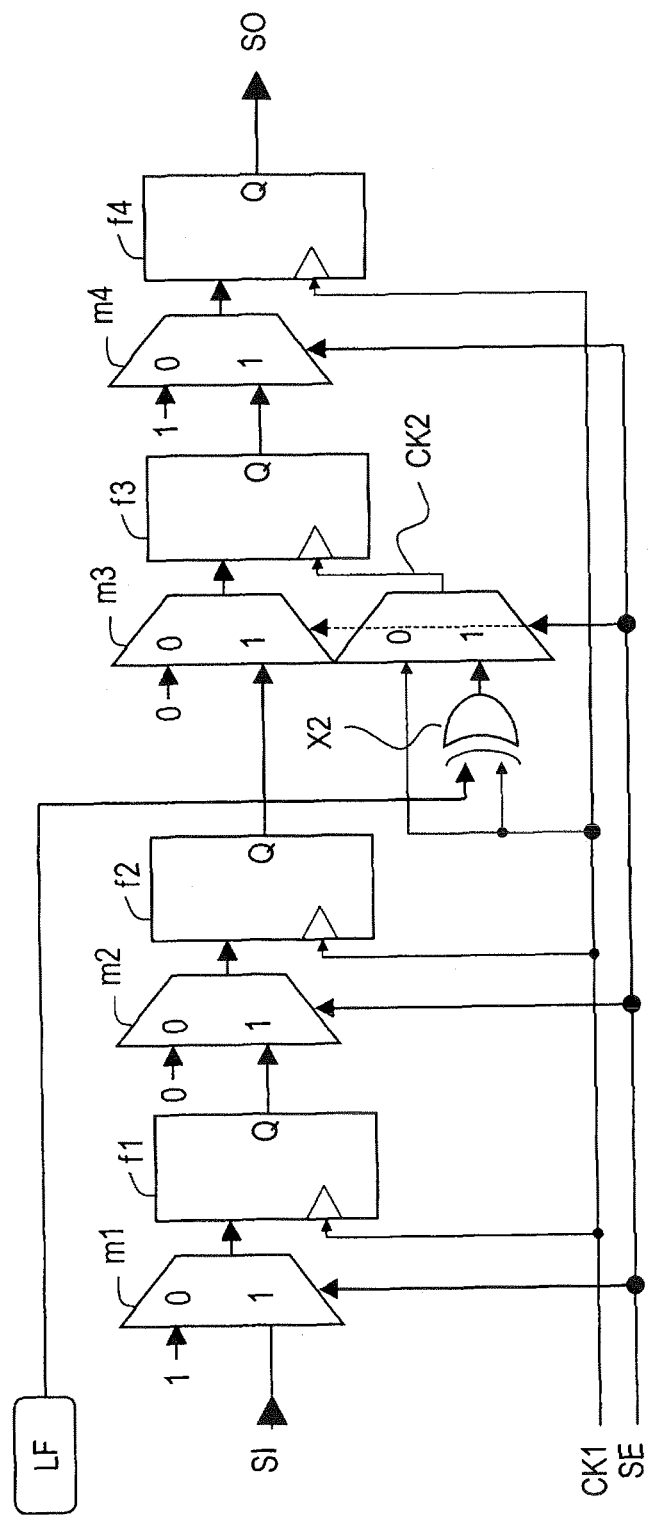
FIG. 9 is a drawing for illustrating an example of a scan chain having a FF f3 which operates in synchronization with a clock signal CK2 different from the timing of the clock signal CK1.

FIG. 9 illustrates an example of a scan chain having a FF f3 which operates in synchronization with a clock signal CK2 (second clock) different from the timing of the clock signal CK1 (first clock). In the figure, the other FFs f1, f2 and f4 operate in synchronization with the first clock signal CK1. Further, the scan chain in the figure has a logic operation circuit X2 (clock generation circuit) which performs an XOR operation on the pseudorandom value output from the pseudorandom number generation circuit LF and the clock signal CK1, and outputs the clock signal CK2. The logic operation circuit X2 is provided in the connection path of the scan chain, and thus the FF f3 operates in synchronization with the clock signal CK1 while in user mode. Below, a specific explanation is given based on waveform diagrams.

Figure 10:
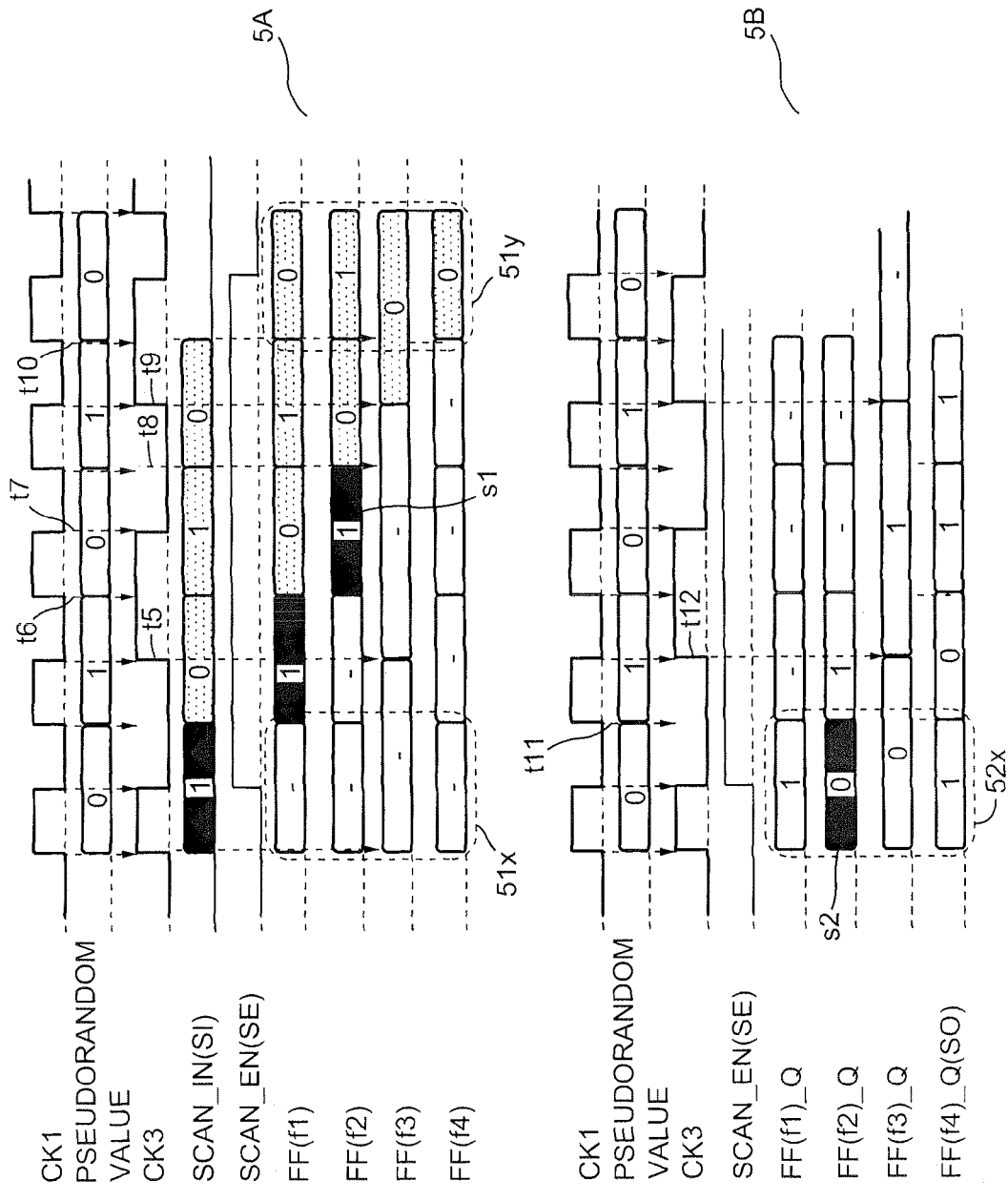
FIG. 10 is a drawing for illustrating waveform diagrams 5A and 5B for the scan chain of FIG. 9.

FIG. 10 presents waveform diagrams 5A and 5B for the scan chain of FIG. 9. The waveform diagram 5A is the waveform diagram for a case in which a data pattern for tests is input from the scan-in terminal SI, and the waveform diagram 5B is the waveform diagram for a case in which values held by the FFs f1 to f4 are output to the scan-out terminal SO. Similarly to the waveform diagrams of FIG. 3, the scan chain has four scan FFs sf1 to sf4, and the input data pattern is 1010.

First the clock signal CK2 is explained. In this example, when the clock signal CK1 and the pseudorandom value are different, the logic operation circuit X2 outputs an H level clock signal CK2 to the FF f3. For example, at time t5 in FIG. 10 the logic operation circuit X2 outputs an H level clock signal CK2 based on the L level clock signal CK1 and the pseudorandom value "1". Next, at time t6, due to the transition of the clock signal CK1 to H level, the logic operation circuit X2 continues to output the H level clock signal CK2 based on an XOR operation with the pseudorandom value "0". And, at time t7 the clock signal CK1 transitions to L level, so that based on an XOR operation with the pseudorandom value "0", the clock signal CK2 transitions to L level. In this way, the clock signal CK2 supplied to the FF f3 makes transitions at times different from those of the clock signal CK1.

Specifically, in the waveform diagram 5A of FIG. 10, at the third clock signal rising edge t8 after the scan enable signal is changed to H level, the FF f2 outputs the first value "1" of the data pattern to the FF f3. However, at time t8 the clock signal CK2 is at L level, and so the FF f3 does not acquire the value "1" output from the FF f2. At time t9 when the clock signal CK2 transitions to H level, the FF f3 acquires the output value from the FF f2. However, the output value from the FF f2 has already transitioned to the second value "0" of the data pattern. Hence the FF f3 acquires the second value "0", and the initial value s1 of the data pattern is skipped. And at time t10, the FF f4 acquires the second value, rather than the initial value of the data pattern.

In this way, the FF f3 performs processing in synchronization with the clock signal CK2, and the other FFs f1, f2 and f4 perform processing in synchronization with the clock signal CK1, so that the values of a portion of the data pattern are omitted, and the data pattern is changed and input to the FFs. In this example, the initial value s1 of the data pattern is omitted, and the values set in the FFs f1 to f4 are changed from the data pattern 1010 (to (0010) (51y). However, a user performing a scan test recognizes the clock signals CK1 and CK2 with which the FFs are synchronized, and so can recognize that data pattern values are changed. Hence the user can prepare a data pattern assuming in advance the value changes and can perform a scan test.

However, even supposing that a third party recognizes that a portion of the FFs forming the scan chain performs processing in synchronization with a clock signal different from that of the other FFs, it would be difficult to identify the operation circuit generating the clock signal and the pseudorandom value pattern, and to generate a data pattern assuming in advance that values are changed. Thus the LSI of this embodiment makes input by a third party of an arbitrary data pattern to the FFs forming the scan chain more difficult, and can more effectively suppress tampering and similar of internal information through misuse of the scan chain.

Next, the waveform 5B, for the case in which values held by the FFs f1 to f4 in FIG. 9 are output to the scan-out terminal SO, is explained. At the first clock signal rising edge t11 after the scan enable signal is changed to H level, the FF f2 outputs the value "0" that was being held to the FF f3. However, at time t8 the clock signal CK2 is at L level, and so the FF f3 does not acquire the value "1" output from the FF f2. At time t12 when the clock signal CK2 transitions to H level, the FF f3 acquires the output value from the FF f2. However, the output value from the FF f2 has already transitioned to the value "1" being held by the FF f1. Hence the FF f3 acquires the value "1" which had been held by the FF f1, and the value "0" or s2 which had been held by the FF f2 is skipped. In this way, because the FF f3 is synchronized with a different clock signal CK2, the values held by a portion of the FFs are not output.

However, a user performing a scan test recognizes the clock signals CK1 and CK2 with which the FFs are synchronized, and so can recognize the change in output values due to omission of values held in a portion of the FFs. Consequently the user, having recognized that some FF values are omitted, can validate the combinational circuit based on valid values.

However, even supposing that a third party recognizes that a portion of the FFs forming the scan chain performs processing in synchronization with a clock signal different from that of the other FFs, it would be difficult to identify the operation circuit generating the clock signal and the pseudorandom value pattern, and identify which values held in FFs have been omitted. Thus the LSI of this embodiment makes acquisition by a third party of internal information held by the FFs forming the scan chain more difficult, and can more effectively suppress leakage and similar of internal information through misuse of the scan chain.

In this way, because the LSI of this embodiment has an FF which while in scan mode operates in synchronization with a clock signal different from that of the other FFs, leakage and tampering of internal information of the LSI by a third party using the scan chain is made more difficult, and the suppression effect can be enhanced. However, a user can generate a data pattern assuming in advance the changes in values by the FF, and can recognize values which have been omitted from the data pattern output to the scan-out terminal SO. Hence the LSI of this embodiment can further enhance the effect of suppressing tampering and leakage of internal information through misuse of the scan chain, while enabling scan tests.

One or a plurality of logic operation circuits may be combined and provided in the scan chain of FIG. 9. As a result the LSI of this embodiment can make analysis of the scan chain by a third party still more difficult.

Figure 11:
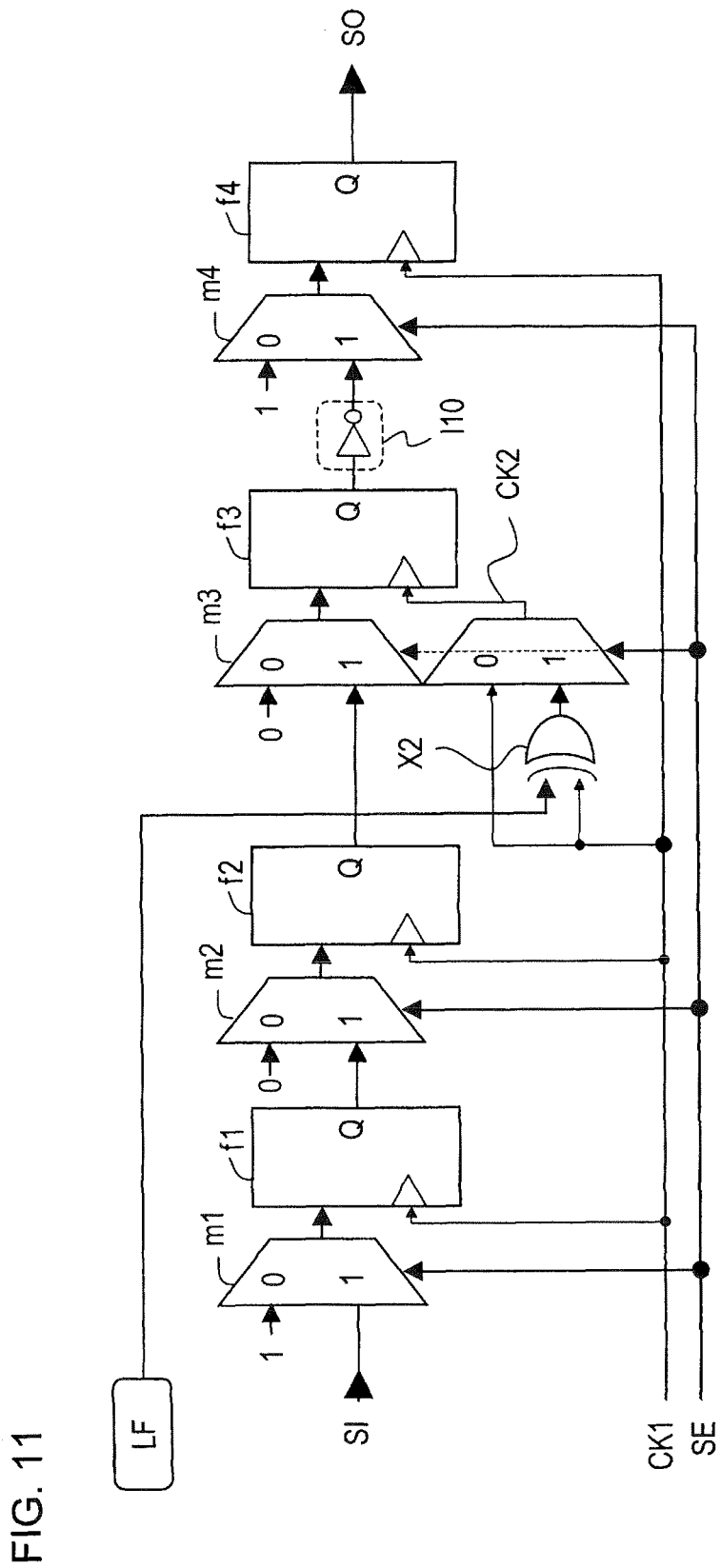
FIG. 11 is a drawing for illustrating an example of the scan chain of FIG. 9 in which a logic inversion circuit 110 is provided.

FIG. 11 illustrates an example of the scan chain of FIG. 9 in which a logic inversion circuit 110 is provided. In the figure, the output value of the FF f3 in synchronization with the different clock signal CK2 is further logic inverted by the logic operation circuit 110, which performs logic inversion, and is output to the FF f4.

Figure 12:
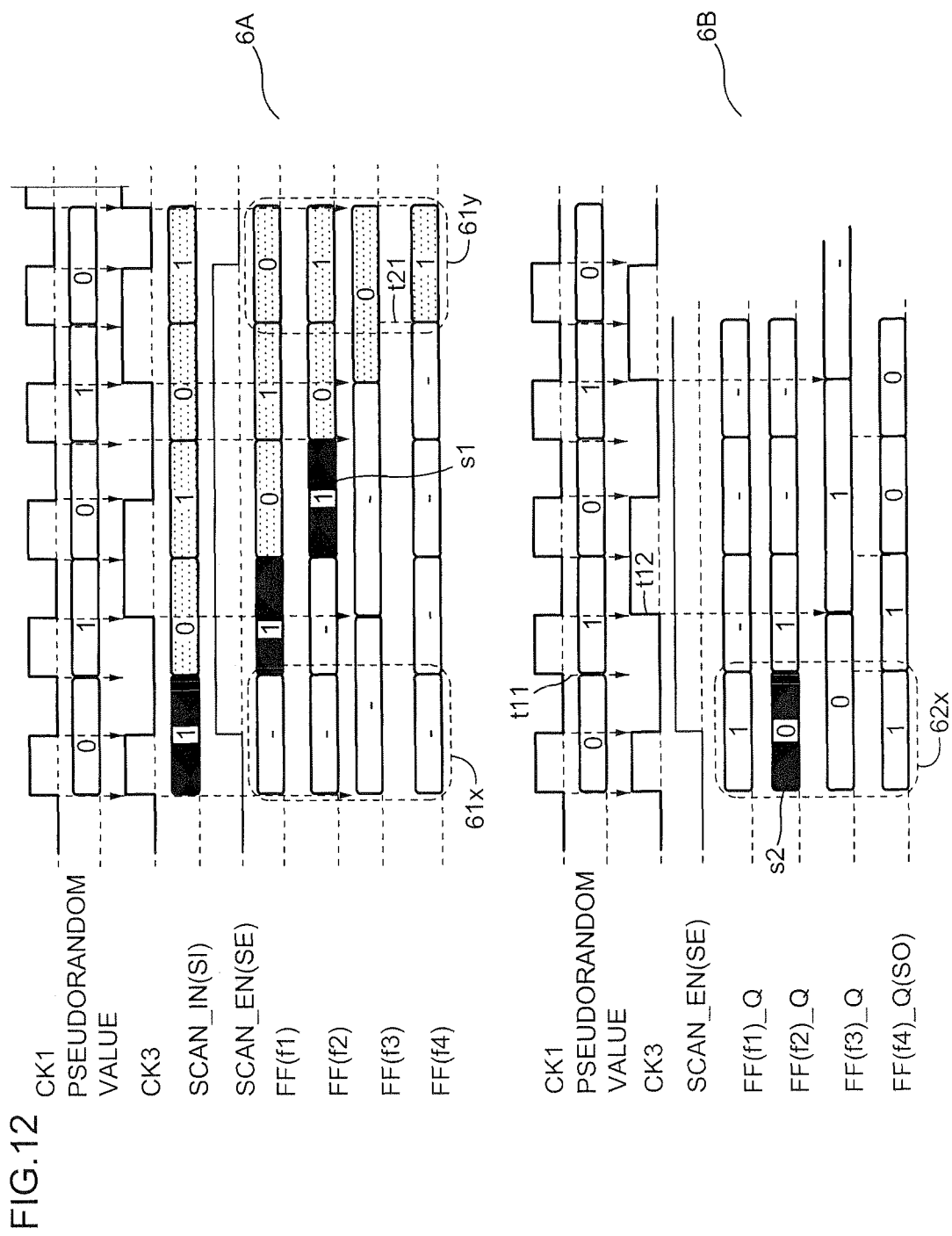
FIG. 12 is a drawing for illustrating waveform diagrams of the scan chain of FIG. 11.

FIG. 12 presents waveform diagrams of the scan chain of FIG. 11. As in the waveform diagram 6A in the figure, at the time of the rising edge t21 of the clock CK1 the FF f4 latches the logic inverted value "1" of the value "0" held by the FF f3. Similarly in the waveform diagram 6B in the figure, at the time of the rising edge of the clock CK1 the FF f4 latches the logic inverted value of the value held by the FF f3. In this way, when a third party inputs and outputs arbitrary data patterns to the FFs to perform validation with the purpose of analyzing the scan chain, the output data pattern changes in a more complex manner. As a result, analysis of the scan chain becomes more complicated, and the effect of suppressing tampering and leakage of internal information is enhanced.

Fifth Embodiment

The LSI of a fifth embodiment has a user circuit with a plurality of FFs, and a connection path which while in test mode (hereafter "scan mode") connects a plurality of FFs to form a scan chain. The connection path has a logic operation circuit such that, prior to product shipment, the logic operation value of a first value and the non-inverted output value of one FF among the plurality of FFs is the non-inverted output value, and after product shipment, the logic operation value of a second value and the non-inverted output value is a constant value. The prescribed values are set to a first value prior to product shipment, and to a second value, different from the first value, after product shipment. Among the plurality of FFs, the other FFs output the non-inverted output values to the following-stage FFs without performance of a logic operation.

As a result, while in scan mode prior to product shipment the LSI enables input of a data pattern to the FFs and output of values held by the FFs, and while in scan mode after product shipment, data pattern values input to FFs and values held by FFs can be reset by a prescribed value and a logic operation.

Consequently the LSI avoids leakage and tampering of internal information through misuse of the scan chain by a third party.

Specifically, in this embodiment an example is explained for a case in which the connection path has a logic operation circuit which, prior to product shipment, outputs as the output value the result of a logical product (hereafter "AND") operation on the H level signal (first value) and the output value from the previous-stage FF, and after product shipment, outputs the value "0" (constant value) as the result of an AND operation on the L level signal (second value) and the output value.

Figure 13:
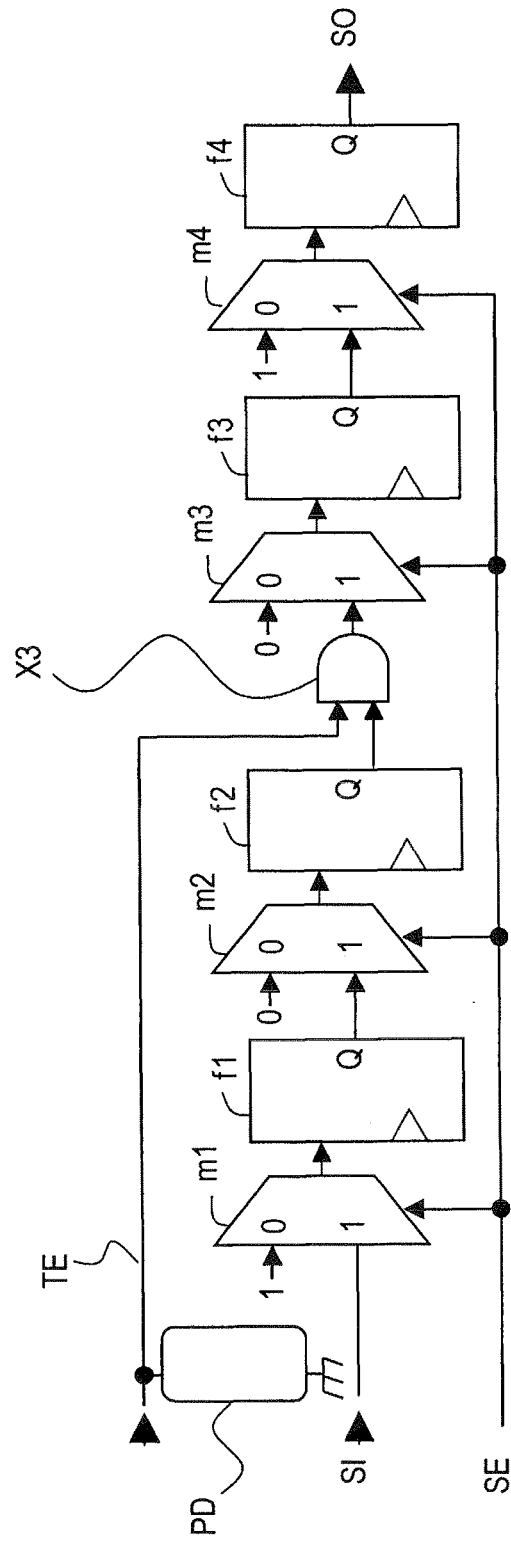
FIG. 13 is a drawing for illustrating an example of a scan chain having a logic operation circuit X3 which, while in scan mode after product shipment, resets the data pattern input values to the FFs and the values held by the FFs.

FIG. 13 illustrates an example of a scan chain having a logic operation circuit X3 which, while in scan mode after product shipment, resets the data pattern input values to the FFs and the values held by the FFs. The logic operation circuit X3 performs a logical product (hereafter "AND") operation on a test signal TE output from a pull-down circuit PD and the output value of the FF f2. In this example, the pull-down circuit PD outputs an H level signal prior to product shipment, and outputs an L level signal after product shipment. Hence the logic operation circuit X3 always outputs the output value from the FF f2 prior to product shipment based on an AND operation on the output value from the FF f2 and the H level test signal TE. Moreover, after product shipment, the logic operation circuit X3 always outputs to the FF f3 the value "0" based on an AND operation on the output value from the FF f2 and the L level test signal TE. Below, a specific explanation is given based on waveform diagrams.

Figure 14:
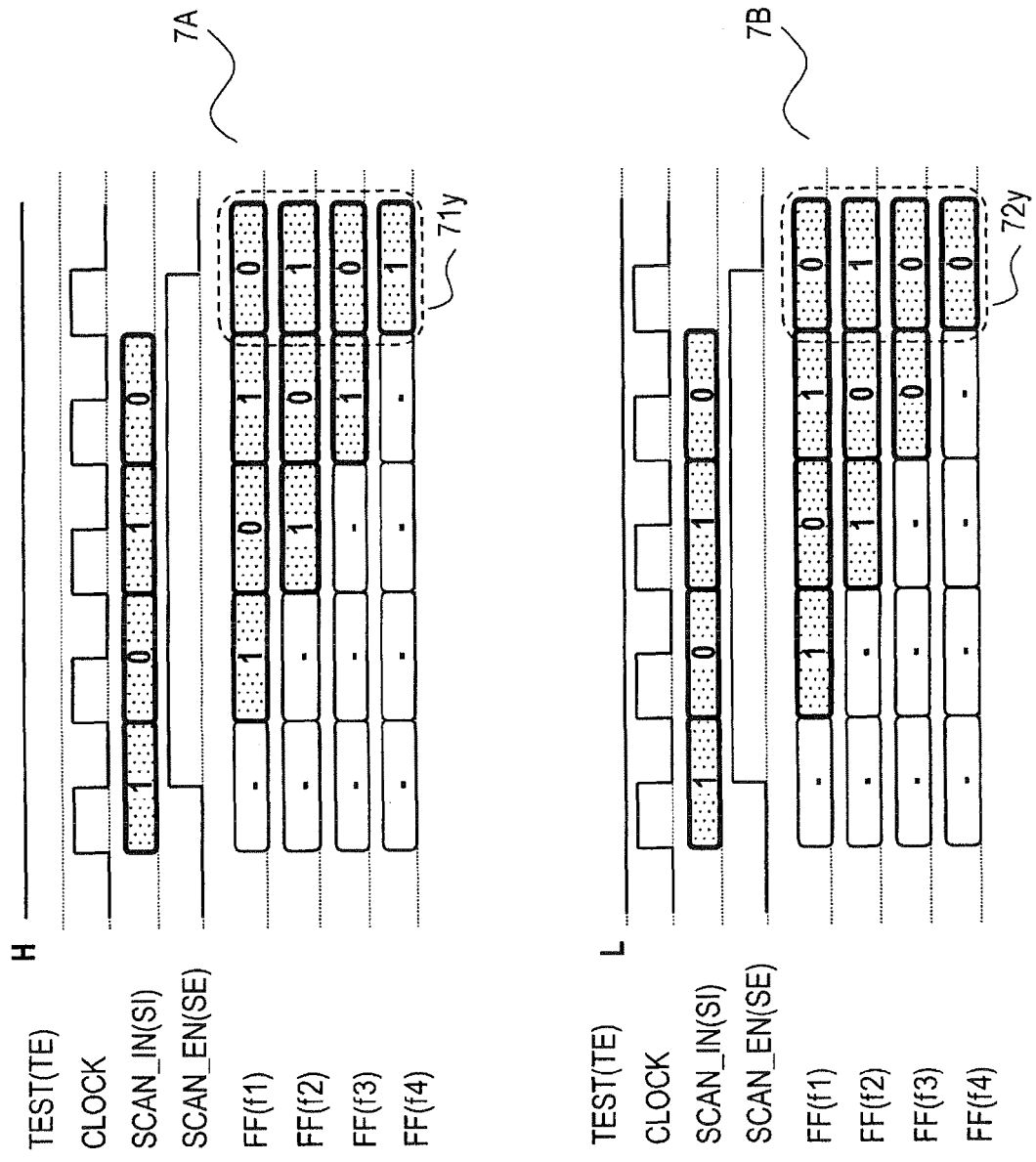
FIG. 14 is a drawing for illustrating waveform diagrams 7A and 7B for the scan chain of FIG. 13.

FIG. 14 presents waveform diagrams 7A and 7B for the scan chain of FIG. 13. The waveform diagram 7A is for before product shipment and the waveform diagram 7B is for after product shipment, while in scan mode, for cases in which a data pattern is input from the scan-in terminal SI. Similarly to the waveform diagrams of FIG. 3, the scan chain has four scan FFs sf1 to sf4, and the input data pattern is 1010.

In the waveform diagram 7A of FIG. 14, while in scan mode prior to product shipment, the test signal TE is set to H level and the scan enable signal SE is set to H level. The logic operation circuit X3, upon each clock cycle rising edge, outputs to the FF f3 the same value as the value output from the FF f2, as the result of an AND operation on the value output from the FF f2 and the H level test signal TE. As a result, while in scan mode prior to product shipment, the data pattern 1010 is input to the FFs f1 to f4 from the scan-in terminal SI (71y).

However, in the waveform diagram 7B, as the scan mode after product shipment, the test signal TE is set to L level and the scan enable signal SE is set to H level. Hence upon each clock cycle rising edge, the logic operation circuit X3 outputs to the FF f3 the value "0" as the result of an AND operation on the value output from the FF f2 and the L level test signal TE. As a result, while in scan mode after product shipment, the value "0" is always input to the FFs f3 and f4 (72y).

In the waveform diagrams of FIG. 14, a case is presented in which a data pattern is input from the scan-in terminal SI, but the same is true of a case in which values held by the FFs f1 to f4 are output to the scan-out terminal SO. As explained above for the waveform diagram 7A, while in scan mode prior to product shipment, the logic operation circuit X3 always outputs the value output from the FF f2 to the FF f3. Hence the values held by the FFs f1 to f4 are not reset, but are output to the scan-out terminal SO. However, while in scan mode after product shipment, the logic operation circuit X3 always outputs the value "0" to the FF f3. Hence among the values held by the FFs f1 to f4, the values held by the FFs f1 and f2 are reset to the value "0" and output to the scan-out terminal SO.

The logic operation circuit which performs reset in this embodiment is not limited to an AND operation circuit. Next, an example of another scan chain is presented in which, while in scan mode after product shipment, data pattern values input to FFs, and values held by FFs, are reset.

Figure 15:
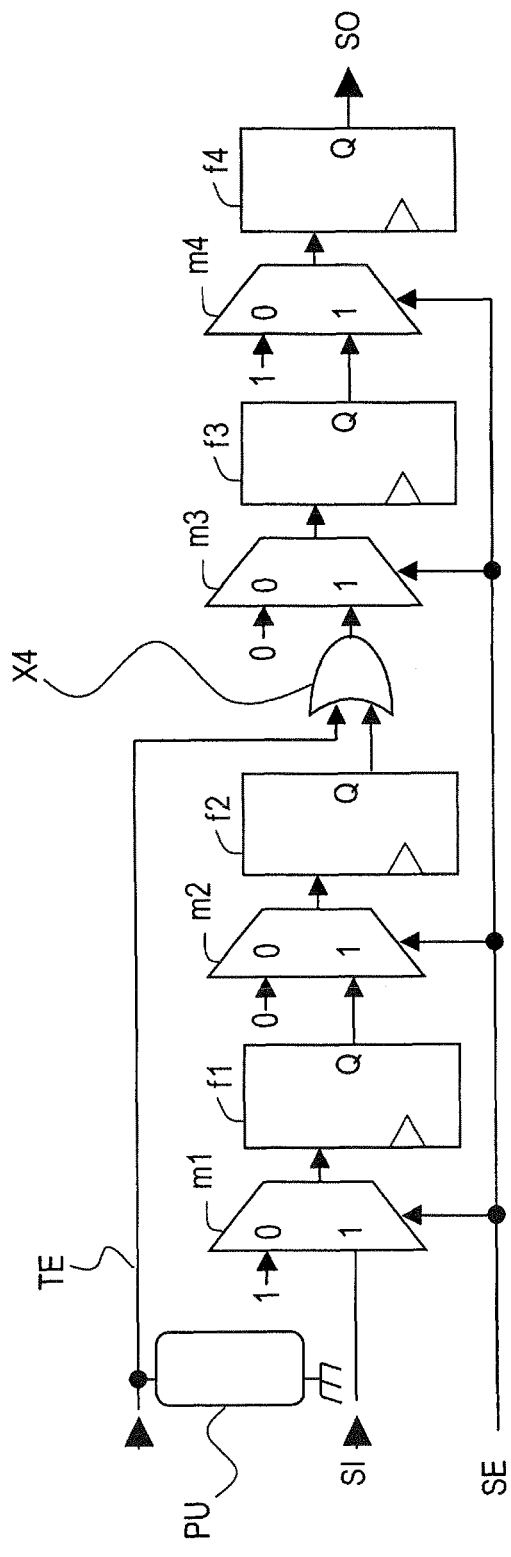
FIG. 15 is a drawing for illustrating an example of a scan chain having a separate logic operation circuit X4 in which, while in scan mode after product shipment, resets the data pattern values input to the FFs and the values held by the FFs.

FIG. 15 illustrates an example of a scan chain having a separate logic operation circuit X4 in which, while in scan mode after product shipment, resets the data pattern values input to the FFs and the values held by the FFs. The logic operation circuit X4 performs a logical sum (hereafter "OR") operation on a test signal TE output from a pull-up circuit PU and the output value of the FF f2. In this example, the pull-up circuit PU outputs an L level signal prior to product shipment, and outputs an H level signal after product shipment. Hence the logic operation circuit X4, prior to product shipment, always outputs to the FF f3 the output value from the FF f2 as the result of an OR operation on the output value from the FF f2 and the L level test signal TE, and after product shipment, always outputs to the FF f3 the value "1" based on an OR operation on the output value from the FF f2 and the H level test signal TE. Below, a specific explanation is given based on waveform diagrams.

Figure 16:
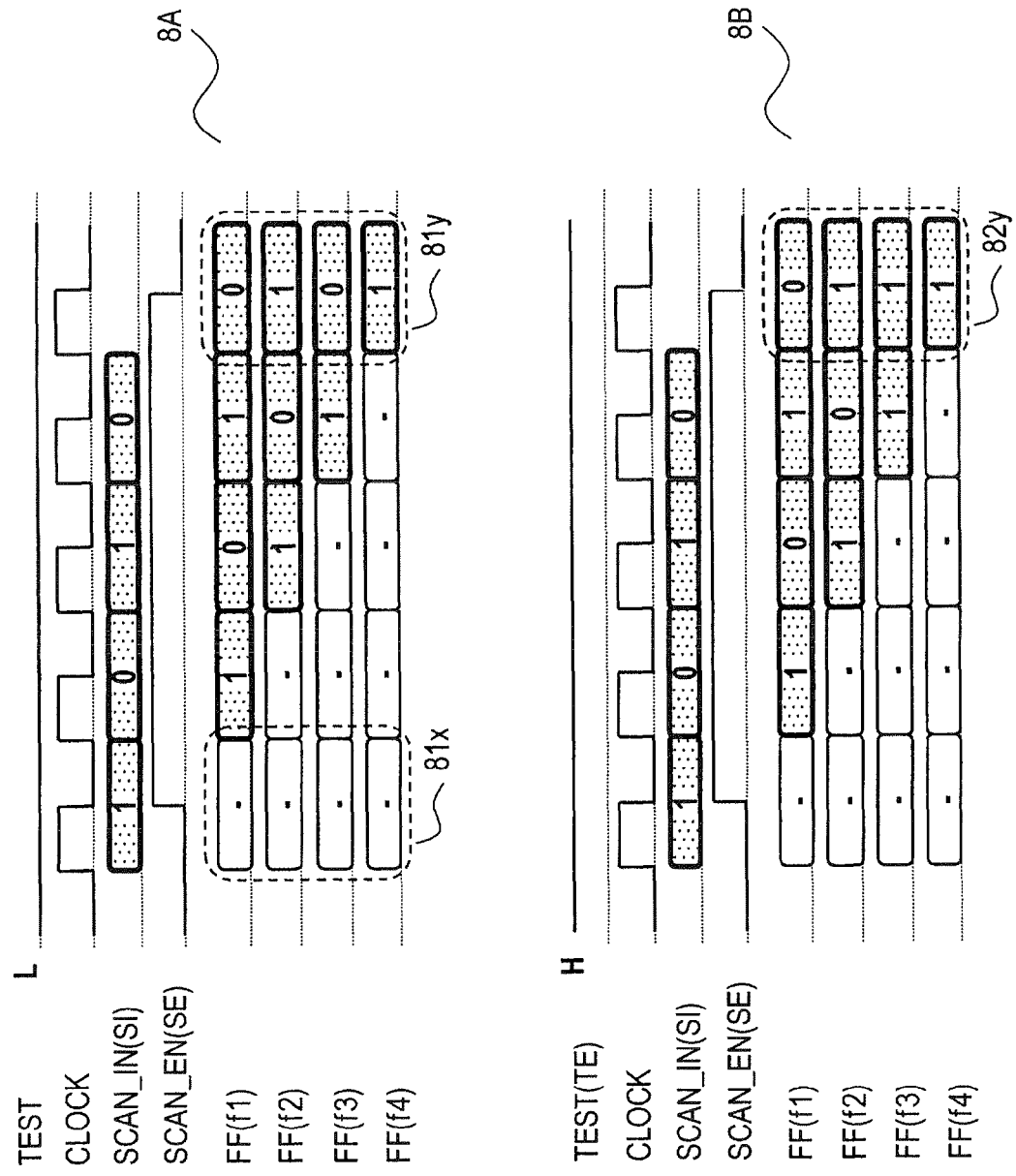
FIG. 16 is a drawing for illustrating waveform diagrams 8A and 8B for the scan chain of FIG. 15.

FIG. 16 presents waveform diagrams 8A and 8B for the scan chain of FIG. 15. The waveform diagrams 8A and 8B are the waveform diagrams while in scan mode, prior to product shipment and after product shipment respectively, for cases in which a data pattern is input from the scan-in terminal SI. Similarly to the waveform diagrams of FIG. 3, the scan chain has four scan FFs sf1 to sf4, and the input data pattern is 1010.

In the waveform diagram 8A of FIG. 16, as the scan mode prior to product shipment, the test signal TE is set to L level and the scan enable signal SE is set to H level. Upon each clock rising edge, the logic operation circuit X4 outputs to the FF f3, as the result of an OR operation on the value output from the FF f2 and the test signal TE fixed at L level, the same value output from the FF f2. As a result, while in scan mode prior to product shipment, the data pattern 1010 is input from the scan-in terminal SI to the FFs f1 to f4 (81y).

However, in the waveform diagram 8B, as the scan mode after product shipment, the test signal TE is set to H level and the scan enable signal SE is set to H level. Hence upon each clock rising edge, the logic operation circuit X4 outputs to the FF f3, as the result of an OR operation on the value output from the FF f2 and the test signal TE fixed at L level, the value "1". As a result, while in scan mode after product shipment, the value "1" is always input to the FFs f3 and f4 (82y).

Thus in the LSI of this embodiment, while in scan mode prior to product shipment, by outputting the output value from the FF of the preceding stage to the logic operation circuit provided in the connection path, input to the FFs of a data pattern, and output of values held by the FFs, are made possible, and scan tests can be performed. However, in the LSI of this embodiment in scan mode after product shipment, by causing the logic operation circuit provided in the connection path to output a constant value, data pattern input values to FFs and values held by FFs are reset. As a result, a third party cannot input an arbitrary data pattern to the scan FFs, and cannot output values held by scan FFs. Hence because the LSI of this embodiment has a logic operation circuit which outputs the output value from the FF of the preceding stage prior to product shipment, and outputs a fixed value after product shipment, leakage and tampering of LSI internal information by a third party using the scan chain after product shipment is avoided, while enabling scan tests prior to product shipment.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of the superiority and inferiority of the embodiments. Although the embodiments have been described in detail, it should be understood that the various changes, substitutions, and alterations could be made hereto without departing from the spirit and scope of the invention.

The invention claimed is:

1. A semiconductor device, comprising:
a user circuit having a plurality of flip-flops; and
a connection path which, while in test mode, connects the plurality of flip-flops and forms a scan chain, and while in user mode, disconnects the plurality of flip-flops and does not form the scan chain, wherein
the connection path has an XOR or XNOR operation circuit which performs an XOR or XNOR operation on a first output value and a prescribed value and outputs a second output value, the first output value being an output value of at least one of the plurality of flip-flops, the second output value being different from the first output value or being same as the first output value depending on the prescribed value, the XOR or XNOR operation circuit being included in the scan chain while in test mode, and
the first output value is restorable based on the prescribed value and a logic of the XOR or XNOR operation circuit.

2. The semiconductor device according to claim 1, wherein the connection path comprises a plurality of the XOR or XNOR operation circuits.

3. The semiconductor device according to claim 1, wherein the prescribed value is a pseudorandom value.

4. A semiconductor device, comprising:
a user circuit having a plurality of flip-flops which operate in synchronization with a first clock signal;
a connection path which, while in test mode, connects the plurality of flip-flops and forms a scan chain performing a shift operation in synchronization with the first clock signal, and while in user mode, disconnects the plurality of flip-flops and does not form the scan chain; and
a clock generation circuit which performs a logic operation on a prescribed value and the first clock signal and outputs a second clock signal, the second clock signal being different from the first clock signal or being same as the first clock signal depending on the prescribed value, wherein,
a first flip-flop among the plurality of flip-flops operates in synchronization with the second clock signal while in test mode, and operates in synchronization with the first clock signal while in user mode, and
while in test mode, the first flip-flop does not input an output value according to the second clock signal when the second clock signal is different from the first clock signal, the output value being output from a second flip-flop at the preceding stage of the first flip-flop according to the first clock signal.

5. The semiconductor device according to claim 4, wherein the logical operation of the clock generation circuit is any of an AND operation, an OR operation, an XOR operation, a NAND operation, a NOR operation, and an XNOR operation.

6. The semiconductor device according to claim 4, wherein the prescribed value is a pseudorandom value.

7. The semiconductor device according to claim 4, wherein the connection path comprises a logic operation circuit or an inverted value connection path, the logic operation circuit configured to perform a logic operation on a non-inverted output value of any flip-flop among the plurality of flip-flops and outputs the result, the inverted value connection path configured to output to a following-stage flip-flop an inverted output value of any flip-flop among the plurality of flip-flops.

* * * * *